US012575253B2

(12) United States Patent
Song et al.

(10) Patent No.: US 12,575,253 B2
(45) Date of Patent: Mar. 10, 2026

(54) ORGANIC LIGHT-EMITTING DIODE AND DISPLAY DEVICE USING SAME

(71) Applicant: LG DISPLAY CO., LTD., Seoul (KR)

(72) Inventors: Wook Song, Paju-si (KR); Yu Jeong Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 1122 days.

(21) Appl. No.: 17/549,660

(22) Filed: Dec. 13, 2021

(65) Prior Publication Data

US 2022/0209159 A1 Jun. 30, 2022

(30) Foreign Application Priority Data

Dec. 29, 2020 (KR) ........................ 10-2020-0186376

(51) Int. Cl.

| | |
|---|---|
| ***H10K 50/155*** | (2023.01) |
| ***H10K 50/11*** | (2023.01) |
| ***H10K 50/13*** | (2023.01) |
| ***H10K 50/15*** | (2023.01) |
| ***H10K 50/16*** | (2023.01) |
| ***H10K 50/17*** | (2023.01) |
| ***H10K 59/12*** | (2023.01) |
| ***H10K 101/40*** | (2023.01) |
| ***H10K 101/60*** | (2023.01) |

(52) U.S. Cl.

CPC ........... *H10K 50/155* (2023.02); *H10K 50/11* (2023.02); *H10K 50/13* (2023.02); *H10K 50/15* (2023.02); *H10K 50/16* (2023.02); *H10K 50/171* (2023.02); *H10K 50/17* (2023.02); *H10K 59/12* (2023.02); *H10K 2101/40* (2023.02); *H10K 2101/60* (2023.02)

(58) Field of Classification Search

CPC ........ C07F 3/006–08; C07F 3/12; C07F 5/06; C07F 7/22; C07F 7/2284; C07F 7/2204; C07F 7/24; C07F 7/28; C07F 9/80–90; C07F 9/92; C07F 15/002; C07F 15/0033; C07F 15/0046; C07F 15/006; C07F 15/0073; C07F 15/0086; C07F 15/02; C07F 15/04; C07F 1/02–12; C07F 3/14; C07F 5/061; C07F 7/30; C07F 9/94; C07F 11/00; C07F 13/00; C07F 15/06; H10K 85/30; H10K 85/321; H10K 85/324; H10K 85/326; H10K 85/331; H10K 85/341; H10K 85/342; H10K 85/344; H10K 85/346; H10K 85/348; H10K 85/351; H10K 85/371; H10K 2101/60; H10K 50/155; H10K 50/13; H10K 50/16; H10K 50/11; H10K 50/171; H10K 50/15; H10K 50/17; H10K 85/381; H10K 50/181; H10K 2101/40; H10K 50/12; C09K 11/06; C09K 2211/18; C09K 2211/181; C09K 2211/182; C09K 2211/183; C09K 2211/184; C09K 2211/185; C09K 2211/186; C09K 2211/187; C09K 2211/188

See application file for complete search history.

(56) References Cited

U.S. PATENT DOCUMENTS

| | | | | |
|---|---|---|---|---|
| 5,998,805 A * | 12/1999 | Shi | H10K 50/171 | 257/97 |
| 2003/0059647 A1 * | 3/2003 | Thompson | H10K 85/322 | 257/88 |
| 2003/0170491 A1 * | 9/2003 | Liao | H05B 45/60 | 257/88 |
| 2005/0202278 A1 * | 9/2005 | Mishima | H10K 50/12 | 313/506 |
| 2012/0097998 A1 | 4/2012 | Pieh et al. | | |
| 2013/0001541 A1 * | 1/2013 | Hayashi | H10K 85/633 | 257/E51.026 |
| 2013/0069073 A1 | 3/2013 | Song et al. | | |
| 2017/0287985 A1 * | 10/2017 | Kim | H10K 50/13 | |

FOREIGN PATENT DOCUMENTS

| | | |
|---|---|---|
| CN | 102456847 A | 5/2012 |
| CN | 103022363 A | 4/2013 |
| CN | 107104193 A | 8/2017 |
| JP | 2001-148540 A | 5/2001 |
| KR | 10-1916904 B1 | 11/2018 |

OTHER PUBLICATIONS

Zhao et al., "Synthesis and Photophysical, Electrochemical, and Electrophosphorescent Properties of a Series of Iridium(III) Complexes Based on Quinoline Derivatives and Different Beta-Diketonate Ligands" Organometallics (2006) vol. 25, pp. 3631-3638. (Year: 2006).*

Office Action dated Jan. 15, 2025 issued in corresponding Chinese Patent Application No. 202111399918.4 with the English translation.

* cited by examiner

*Primary Examiner* — Dylan C Kershner

(74) *Attorney, Agent, or Firm* — Morgan, Lewis & Bockius LLP

(57) ABSTRACT

An organic light-emitting diode and a display device using the same are provided. An organic light-emitting diode includes: a hole injection layer, a hole transport layer on the hole injection layer, a first emission layer configured to generate light of a short wavelength in a visible band, the first emission layer being on the hole transport layer, wherein one or more of the hole injection layer and the hole transport layer includes a phosphorescent dopant material at an interface between the hole injection layer and the hole transport layer.

17 Claims, 18 Drawing Sheets

| |
|---|
| CAT |
| EIL |
| ETL |
| B-EML1 |
| EBL |
| HTL |
| HIL |
| ANO |

| |
|---|
| CAT |
| EIL |
| ETL |
| B-EML1 |
| EBL |
| HTL |
| ADL(RD5%) |
| HIL |
| ANO |

| CAT |
|---|
| EIL |
| ETL |
| B-EML2 |
| EBL |
| HTL |
| CGL2 |
| ETL |
| G-EML |
| R-EML |
| HTL |
| CGL1 |
| ETL |
| B-EML1 |
| EBL |
| HTL |
| HIL |
| ANO |

ORGANIC LIGHT-EMITTING DIODE AND DISPLAY DEVICE USING SAME

CROSS-REFERENCE TO RELATED APPLICATION(S)

This application claims the benefit of and priority to Korean Patent Application No. 10-2020-0186376, filed on Dec. 29, 2020, the entirety of which is hereby incorporated by reference.

BACKGROUND

1. Technical Field

The present disclosure relates to an organic light-emitting diode and a display device using the same.

2. Discussion of the Related Art

Electroluminescent display devices may be roughly classified into inorganic light-emitting display devices and organic light-emitting display devices, depending on the material of the emission layer. The organic light-emitting display device of an active matrix type includes an organic light-emitting diode (hereinafter, referred to as "OLED") that emits light by itself, and has an advantage in that the response speed is fast and the luminous efficiency, luminance, and viewing angle may be large. In the organic light-emitting display device, a light-emitting diode (e.g., an organic light-emitting diode, referred to as "OLED") is formed in each pixel. The organic light-emitting display device has a fast response speed, excellent luminous efficiency, luminance, and viewing angle, and has excellent contrast ratio and color reproducibility because it can express black gradations in complete black.

The organic light-emitting display device does not require a backlight unit, and may be implemented on a plastic substrate, a thin glass substrate, or a metal substrate, which may be a flexible material. When the OLED element is driven for a long time, its driving voltage increases due to deterioration of the material constituting the OLED element, which adversely affects the lifetime.

SUMMARY

Accordingly, the present disclosure is directed to an organic light-emitting diode and a display device using the same that substantially obviate one or more of the issues due to limitations and disadvantages of the related art.

An aspect of the present disclosure is to provide an OLED element, in which the problem of deterioration of the OLED element and an increase in its driving voltage is improved, and a display device using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting diode, including: a hole injection layer, a hole transport layer on the hole injection layer, a first emission layer configured to generate light of a short wavelength in a visible band, the first emission layer being on the hole transport layer, the first emission layer being on the hole transport layer, wherein one or more of the hole injection layer and the hole transport layer includes a phosphorescent dopant material at an interface between the hole injection layer and the hole transport layer.

In another aspect, there is provided organic light-emitting diode, including: an anode electrode, a cathode electrode, a first stack including: a hole injection layer on the anode electrode, a hole transport layer on the hole injection layer, a first emission layer on the hole transport layer, the first emission layer being configured to emit light having a peak wavelength within a range of 430 nm to 480 nm, and one or more of the hole injection layer and the hole transport layer including a phosphorescent dopant material at an interface between the hole injection layer and the hole transport layer, and a second stack between the cathode electrode and the first stack, the second stack including at least one second emission layer configured to emit light having a wavelength longer than a wavelength of light emitted from the first emission layer, wherein the interface between the hole injection layer and the hole transport layer is configured to: absorb light from the first emission layer using the phosphorescent dopant material, and emit light having a wavelength of 550 nm or more in a visible band.

In another aspect, there is provided a display device, including: a display panel in which pixels displaying an input image may be arranged, and a display panel driver configured to write pixel data of the input image to the pixels of the display panel, wherein each of the pixels includes: an organic light-emitting diode, including: a hole injection layer, a hole transport layer on the hole injection layer, and a first emission layer configured to generate light of a short wavelength in a visible band, the first emission layer being on the hole transport layer, and a phosphorescent dopant material added to at least one of: the hole injection layer and the hole transport layer at an interface between the hole injection layer and the hole transport layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages may be discussed below in conjunction with embodiments of the disclosure. It is to be understood that both the foregoing general description and the following detailed description of the present disclosure may be examples and explanatory, and may be intended to provide further explanation of the disclosure as claimed.

BRIEF DESCRIPTION OF THE DRAWINGS

The accompanying drawings, that may be included to provide a further understanding of the disclosure and may be incorporated in and constitute a part of this disclosure, illustrate embodiments of the disclosure and together with the description serve to explain various principles of the disclosure.

Figure 1:
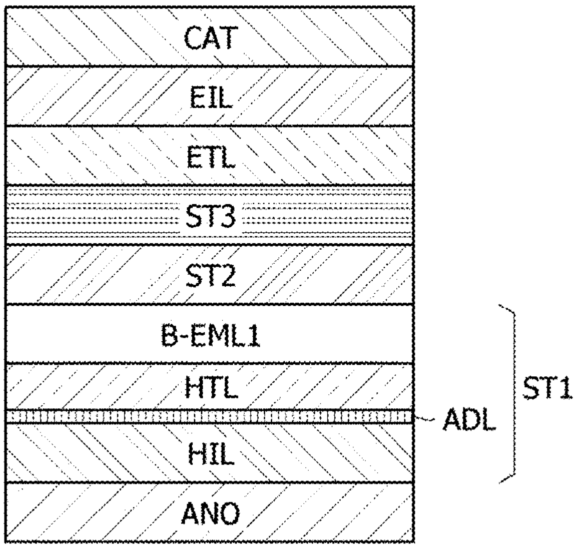
FIG. 1 is a cross-sectional view showing a cross-sectional structure of an OLED element according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments may be provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure may be merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. When terms "include," "have," and "include" described in the present disclosure may be used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case that is not continuous may be included, unless a more limiting term, such as "just," "immediate(ly)," or "direct(ly)," is used.

It will be understood that, although the terms "first," "second," etc. May be used herein to describe various elements, these elements should not be limited by these terms. These terms may be only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms may be merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings may be given merely for the convenience of description, and embodiments of the present disclosure may be not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term “part” or “unit” may apply, for example, to a separate circuit or structure, an integrated circuit, a computational block of a circuit device, or any structure configured to perform a described function as should be understood to one of ordinary skill in the art.

Hereinafter, example embodiments of the present disclosure will be described in detail with reference to the accompanying drawings.

Figure 2:
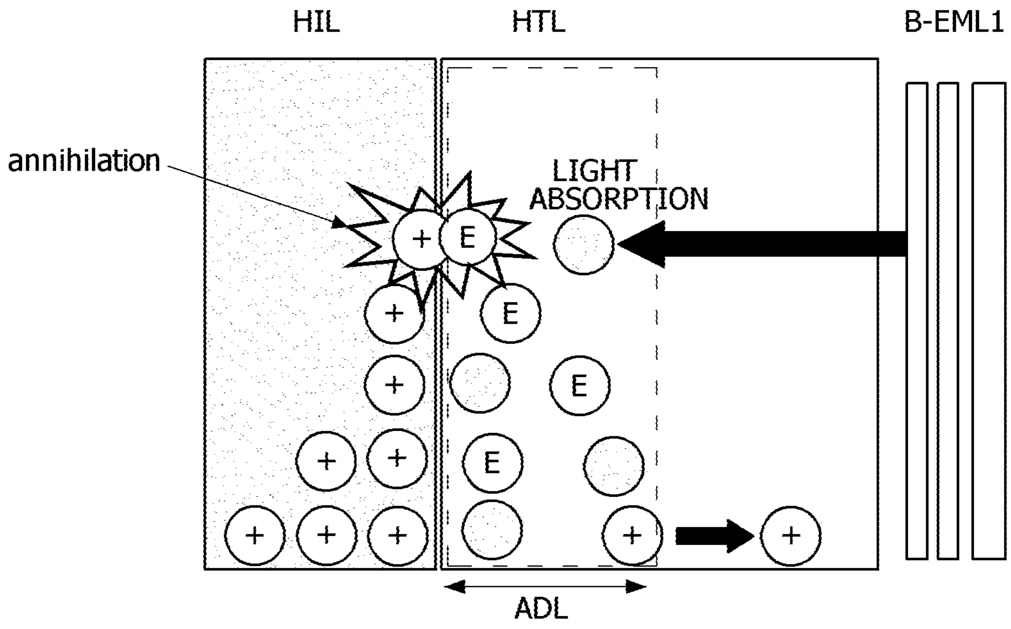
FIG. 2 is a diagram showing triplet-polaron annihilation occurring in a light absorption layer shown in FIG. 1.
Figure 3A:
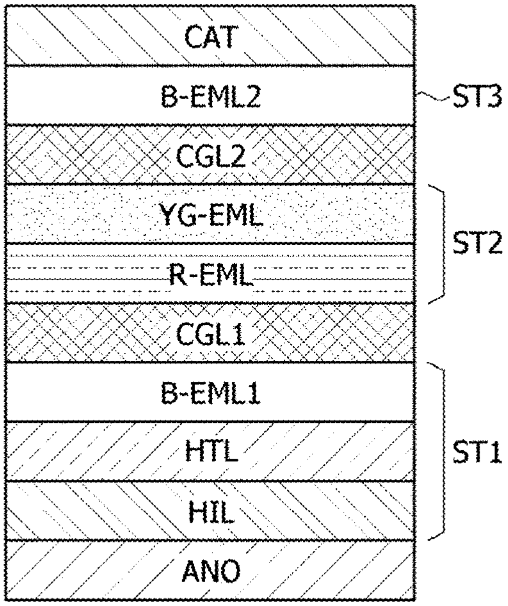
FIGS. 3A to 3C are diagrams showing emission layers of the OLED element shown in FIG. 1.
Figure 3B:
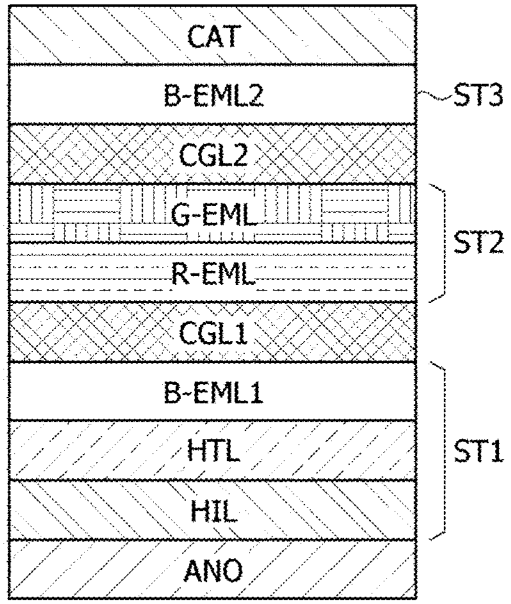
Figure 3C:
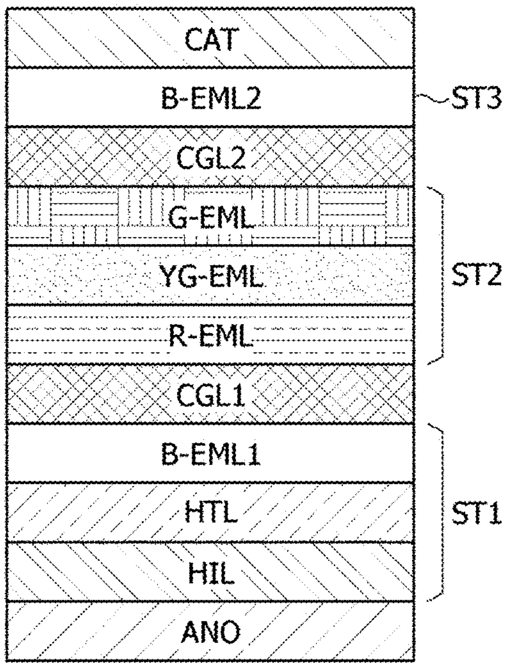

FIG. 1 is a cross-sectional view showing a cross-sectional structure of an OLED element according to an embodiment of the present disclosure. FIG. 2 is a diagram showing triplet-polaron annihilation occurring in a light absorption layer shown in FIG. 1. FIGS. 3A to 3C are diagrams showing emission layers of the OLED element shown in FIG. 1. In FIGS. 3A to 3C, a light absorption layer ADL, an electron injection layer EIL and an electron transport layer ETL may be omitted.

With reference to FIGS. 1 and 2, an OLED element may include at least first and second stacks stacked between a cathode electrode CAT and an anode electrode ANO. The OLED element may have a structure of first to third stacks ST1, ST2, and ST3, but is not limited thereto. For example, the OLED element may be implemented as a two-stack structure without the third stack ST3.

An electron injection layer EIL and an electron transport layer ETL may be stacked between the third stack ST3 and the cathode electrode CAT. When there is no third stack ST3, the electron injection layer EIL and the electron transport layer ETL may be stacked between the second stack ST2 and the cathode electrode CAT.

The anode electrode ANO may be formed of a transparent electrode material, e.g., indium tin oxide (ITO), but is not limited thereto. As an example, the anode electrode ANO may be formed of a transparent conductive oxide (TCO), such as indium zinc oxide (IZO). The cathode electrode CAT may be formed of aluminum (Al), but is not limited thereto. For example, the cathode electrode CAT may be a translucent electrode, e.g., formed of magnesium-silver (Mg—Ag).

The driving voltage of the OLED element may be applied to the cathode electrode CAT and the anode electrode ANO. The cathode electrode CAT may be a common electrode formed over the entire substrate of a display device. The anode electrode ANO may be divided for each sub-pixel on the substrate of the display device, and a different voltage may be applied for each sub-pixel according to the data voltage of pixel data. When the voltage between the cathode electrode CAT and the anode electrode ANO is greater than or equal to the threshold voltage of the OLED element, the OLED element may emit light. The first to third stacks may include emission layers having different peak wavelengths. When a driving voltage is applied to the OLED element, electric charges may be injected into the emission layer, and excitons may be formed by the combination of electrons and holes in the emission layer and then annihilated, while emitting light of a wavelength determined by the material of the emission layer.

The stacked structure of the first to third stacks ST1, ST2, and ST3 may include a plurality of light-emitting materials having different photoluminescence peaks to emit white light. To emit visible light of different wavelengths in the sub-pixels of the display device, a color filter layer or a color conversion layer may be disposed above the cathode electrode CAT or below the anode electrode ANO.

The first stack ST1 may be disposed closest to the anode electrode ANO. The first stack ST1 may include a hole injection layer HIL, a light absorption layer (absorption dopant material layer) ADL, a hole transport layer HTL, and a first emission layer (blue-emitting material layer) B-EML1. The first emission layer B-EML1 may include at least one host material and a dopant material for emitting blue light, and may emit blue light when a driving voltage is applied to the OLED element. The peak wavelength of light emitted from the first stack ST1 may range from 430 nm to 480 nm.

The light absorption layer ADL may be formed by adding a phosphorescent dopant material to at least one of the hole injection layer HIL and the hole transport layer HTL at an interface between the hole injection layer HIL and the hole transport layer HTL. As shown in FIG. 2, when the OLED element is driven, the light absorption layer ADL may absorb light of a short wavelength in the visible band to generate triplet excitons, and may induce triplet-polaron annihilation in which holes and triplet excitons may be combined. As a result, the light absorption layer ADL may reduce or prevent deterioration of the interface between the hole injection layer HIL and the hole transport layer HTL due to hole accumulation, and may reduce or minimize the increase in the driving voltage required for driving the OLED element when the driving time of the OLED element elapses, thereby improving the problems of deterioration of the OLED element and increasing the driving voltage.

To implement the light absorption layer ADL, a phosphorescent dopant may be desirable as the dopant material doped into the hole injection layer HIL or the hole transport layer HTL. When the hole injection layer HIL is made of a compound containing an inorganic material, triplet excitons may be difficult to form or rare to occur, even if the phosphorescent dopant is added. Therefore, when the hole injection layer HIL contains an inorganic material, the phosphorescent dopant may preferably be doped into the hole transport layer HTL for implementing the light absorption layer ADL. Particularly, the phosphorescent dopant as the dopant material may be doped into a surface portion of one or more of the hole injection layer HIL and the hole transport layer HTL.

In the case of a fluorescent dopant, because a singlet exciton lifetime may be short, the rate at which inter-system crossing occurs may be reduced by emitting light immediately after absorbing light, so that the hole annihilation effect may be small. On the other hand, because the phosphorescent dopant contains triplet excitons, when it absorbs light, triplet-polaron annihilation occurs. Accordingly, when the phosphorescent dopant is included in the light absorption layer ADL, it may be possible to increase the hole annihilation effect at the interface between the hole injection layer HIL and the hole transport layer HTL.

In the case of a thermally activated delayed fluorescence (TADF) dopant, there may be no hole annihilation effect. An iridium (Ir)-based or platinum (Pt)-based phosphorescent dopant material may provide the hole annihilation effect in the light absorption layer ADL. As an example, an Ir-based red phosphorescent dopant material that can be used as the phosphorescent dopant of the light absorption layer ADL may include, but is not limited to, a phosphorescent dopant material such as $Ir(piq)_2(acac)$(bis(1-phenylisoquinoline) acetylacetonate iridium(III)) or $Ir(piq)_3$(tris(1-phenylisoquinoline)iridium(III)).

Although light may be generated when triplet excitons and holes are combined in the light absorption layer ADL, an experimental result shows that there is no problem of image quality deterioration caused by light generated from the light absorption layer ADL by satisfying a target value of white light in the color coordinate.

The hole injection layer HIL may be disposed on the anode electrode ANO, and may smoothly supply holes from the anode electrode ANO to the first emission layer B-EML1. The hole injection layer HIL may be formed of one or more of: $MoO_3$, copperphthalocyanine (CuPc), poly (3,4)-ethylenedioxythiophene (PEDOT), polyaniline (PANT), and N,N-bis(naphthalene-1-yl)-N,N'-bis(phenyl)-2,2'-dimethylbenzidine (NPD), but is not limited thereto.

The hole injection layer HIL may be formed of a compound in which an organic material and an inorganic material are mixed. The organic material may be rubrene, and the inorganic material may be magnesium fluoride ($MgF_2$), although materials are not limited thereto. In this case, even if the phosphorescent dopant material may be doped in the hole injection layer HIL, triplet excitons may be difficult to form or rare to occur, so that the phosphorescent dopant material for implementing the light absorption layer ADL may preferably be doped into an organic material (host material) of the hole transport layer HTL made of only organic material.

The hole transport layer HTL may be disposed above the hole injection layer HIL, and may smoothly transport holes moving to the first emission layer B-EML1. The hole transport layer HTL may be a single layer of a mixed structure including two types of materials, e.g., a first material and a second material, having different properties. The phosphorescent dopant material for implementing the light absorption layer ADL may be doped into the hole transport layer HTL.

The first material of the hole transport layer HTL may be selected as a material having a higher hole mobility than the second material to improve the hole movement to the first emission layer B-EML1. The first material may include at least any one of N,N'-bis(naphthalene-1-yl)-N,N'-bis(phenyl)-2,2'-dimethylbenzidine (α-NPD), 4,4',4"-tris(carbazol-9-yl)triphenylamine (TCTA), N,N'-bis(3-methylphenyl)-N,N'-bis(phenyl)-benzidine (TPD), tetra-N-phenylbenzidine (TPB), 1,1-Bis[(di-4-tolylamino)phenyl]cyclohexane (TAPC), m-TPEE, fluorinatedtriphenyldiamine (FTPD), TRP, p-phenylenediamine (PPD), or OPT1. m-TPEE may be a compound represented by the following Chemical Formula 1. TRP may be a compound represented by Chemical Formula 2. OTP1 may be a compound represented by Chemical Formula 3.

[Chemical Formula 1]

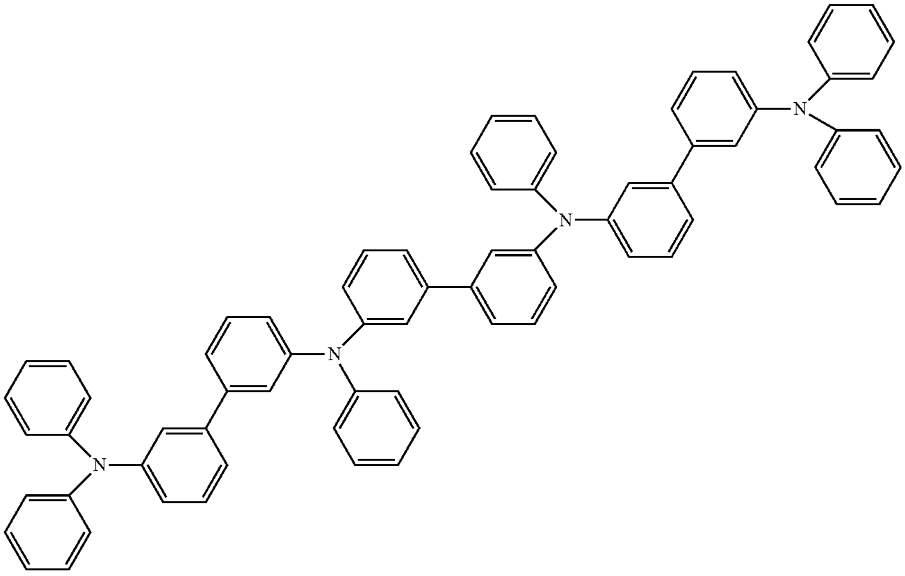

-continued

[Chemical Formula 2]

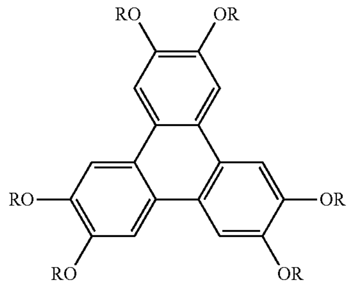

[Chemical Formula 3]

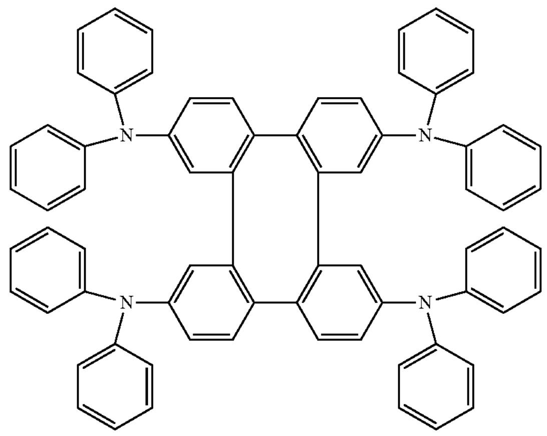

The second material of the hole transport layer HTL may be a material having a higher triplet energy level than the first material, e.g., to reduce electron diffusion from the first emission layer B-EML1. Further, the second material of the hole transport layer HTL may be a material having a lower highest occupied molecular orbital (HOMO) level than the first material, e.g., to minimize the accumulation of holes at the interface between the hole transport layer HTL and the first emission layer B-EML1. Furthermore, the second material may be a material having high thermal stability, e.g., to improve the durability of the hole transport layer. The second material may be an organic compound containing a spirofluorene group, but is not limited thereto.

When the hole transport layer HTL is configured in a mixed structure, the movement of holes flowing from the hole transport layer HTL to the first emission layer B-EML1 may be improved. Also, the movement of electrons flowing from the first emission layer B-EML1 to the hole transport layer HTL may be reduced, thereby obtaining the effect of improving the driving voltage, luminous efficiency, and lifetime.

With reference to FIGS. 1 and 3A to 3C, the second stack ST2 may be disposed between the first stack ST1 and the third stack ST3. The first stack ST1 may include the hole injection layer HIL disposed on the anode electrode ANO, the hole transport layer HTL disposed above the hole injection layer HIL, the first emission layer B-EML1 disposed on the hole transport layer HTL to emit light having a peak wavelength within a range of 430 nm to 480 nm, and the light absorption layer ADL disposed at the interface between the hole injection layer HIL and the hole transport layer HTL. The light absorption layer ADL may contain a phosphorescent dopant material that is also added to (e.g., doped in) at least one of the hole injection layer HIL and the hole transport layer HTL. The light absorption layer ADL may absorb light from the first emission layer B-EML1 using the phosphorescent dopant to emit light having a wavelength of 550 nm or more within a visible band.

The second stack ST2 may be disposed between the cathode electrode CAT and the first stack ST1. The second stack ST2 may include at least one second emission layer that may emit light having a wavelength longer than that of light emitted from the first emission layer B-EML1.

The third stack ST3 may be disposed between the cathode electrode CAT and the second stack ST2. The third stack ST3 may include a third emission layer B-EML2 that may emit light having a wavelength substantially the same as that of the light emitted from the first emission layer B-EML1.

The second emission layer may emit light having a wavelength different from that of the light emitted from the first emission layer B-EML1. The second emission layer may include one or more emission layers, or may include two or more emission layers having different peak wavelengths. For example, the second emission layer, according to one embodiment may have, as shown in FIG. 3A, a structure in which a first red emission layer R-EML, including at least one host material and a dopant for emitting red light, and a second yellow-green emission layer YG-EML, including at least one host material and a dopant for emitting yellow-green light, may be stacked. The peak wavelength of light emitted from the first red emission layer R-EML may range from 600 nm to 650 nm. The peak wavelength of light emitted from the second yellow-green emission layer YG-EML may range from 510 nm to 580 nm.

The second emission layer, according to another embodiment may have, as shown in FIG. 3B, a structure in which a first red emission layer R-EML, including at least one host material and a dopant for emitting red light, and a second green emission layer G-EML, including at least one host material and a dopant for emitting green light, may be stacked. The peak wavelength of light emitted from the second emission layer G-EML may range from 500 nm to 570 nm.

The second emission layer, according to still another embodiment may have, as shown in FIG. 3C, a structure in which a first red emission layer R-EML, including at least one host material and a dopant for emitting red light, a second yellow-green emission layer YG-EML, including at least one host material and a dopant for emitting yellow-green light, and a third green emission layer G-EML, including at least one host material and a dopant for emitting green light, may be stacked.

The first stack ST1 may further include a second electron transport layer disposed on the first emission layer B-EML1. The second stack ST2 may further include a second hole transport layer disposed under the second emission layer. The second electron transport layer and the second hole transport layer are omitted from the drawings.

A first charge generation layer CGL1 may be disposed between the first stack ST1 and the second stack ST2. The first charge generation layer CGL1 may be divided into an n-type charge generation layer (nCGL) and a p-type charge generation layer (pCGL). The n-type charge generation layer may be disposed on the second electron transport layer. The p-type charge generation layer may be disposed between the n-type charge generation layer and the second hole transport layer.

The third stack ST3 may include the third emission layer B-EML2. The third emission layer B-EML2 may emit blue light by including at least one host material and a dopant material for emitting blue light. The peak wavelength of light emitted from the third stack ST3 may range from 430 nm to 480 nm. The third stack ST3 may increase the efficiency of a blue emission layer having relatively low efficiency.

As illustrated in FIG. 1, the electron injection layer EIL and the electron transport layer ETL may be stacked between the third stack ST3 and the cathode electrode CAT. The electron injection layer EIL may be disposed between the cathode electrode CAT and the electron transport layer ETL. The electron transport layer ETL may be disposed between the electron injection layer EIL and the third stack ST3. In the absence of the third stack ST3, the electron transport layer ETL may be disposed between the electron injection layer EIL and the second stack ST2.

The second stack ST2 may further include a third electron transport layer disposed on the second emission layer. The third stack ST3 may further include a third hole transport layer disposed under the third emission layer B-EML2. The third electron transport layer and the third hole transport layer are omitted from the drawings.

A second charge generation layer CGL2 may be disposed between the second stack ST2 and the third stack ST3. The second charge generation layer CGL2 may be divided into an n-type charge generation layer and a p-type charge generation layer. The n-type charge generation layer may be disposed on the third electron transport layer. The p-type charge generation layer may be disposed between the n-type charge generation layer and the third hole transport layer.

As a host material of an emission layer emitting red light, an h-host may include DNTPD, and an e-host may include DCzTrz. The dopant material of the emission layer emitting red light may include one or more phosphorescent materials including one or more of: $Ir(piq)_2(acac)$(bis(1-phenylisoquinoline)acetylacetonate iridium(III)) and $Ir(piq)_3$(tris(1-phenylisoquinoline)iridium(III)). Embodiments are not limited thereto.

As a host material of an emission layer emitting green light, an h-host may include CBP, and an e-host may include TPBI (1,3,5-tris(N-phenylbenzimiazole-2-yl)benzene). The dopant material of the emission layer emitting green light may include $Ir(ppy)_3$. Embodiments are not limited thereto.

The host material of an emission layer emitting blue light may include 2-methyl-9,10-bis(naphthalen-2-yl)anthracene (MADN). The dopant material of the emission layer emitting blue light may include a boron-based blue fluorescent dopant, such as 5,9-diphenyl-5,9-dihydro-5,9-diaza-13b-boranaphtho[3,2,1-de]anthracene (DABNA-1). Embodiments are not limited thereto.

The light absorption layer ADL may absorb short wavelength light in the visible wavelength band, e.g., to reduce or prevent deterioration of the interface between the hole injection layer HIL and the hole transport layer HTL when the OLED element is driven for a long time, thereby reducing or minimizing the increase in the driving voltage of the OLED element. The conditions of the light absorption layer ADL capable of obtaining such an effect may be as follows.

A triplet energy level T1 of the light absorption layer ADL may be 2.5 eV≥T1≥2.0 eV, e.g., from 2.0 eV to 2.5 eV. The highest occupied molecular orbital (HOMO) level of the light absorption layer ADL may be equal to or smaller than the HOMO level of the hole transport layer HTL to not interfere with the flow of holes. The light absorption spectrum of the light absorption layer ADL may be a short wavelength, e.g., 530 nm or less, in the visible wavelength band. The peak spectrum of light emitted from the light absorption layer ADL may be a wavelength of 550 nm or more.

The thickness of the light absorption layer ADL may be set in a range from 50 Å to 300 Å (or from 5 nm to 30 nm). If the thickness of the light absorption layer ADL is be less than 50 Å (or 5 nm), because the light absorption layer ADL may be too thin, the triplet-polaron annihilation effect at the interface between the hole injection layer HIL and the hole transport layer HTL may be small. If the thickness of the light absorption layer ADL is greater than 300 Å (or 30 nm), blue light emitted from the first emission layer B-EML1 may be lost.

In the light absorption layer ADL, the concentration of the phosphorescent dopant material doped to the host material may range from 0.1% to 15%. Here, the concentration (%) may be a weight percent (wt %). Hereinafter, the concentration (%) refers to weight percent (wt %). If the doping concentration is lower than 0.1%, the amount of the phosphorescent dopant in the light absorption layer ADL may be insufficient, so that the triplet-polaron annihilation effect may be greatly reduced. If the doping concentration is higher than 15%, the holes move to the phosphorescent dopant material without moving to the hole transport layer HTL, so that the electrical properties of the OLED element may change, and the triplet-polaron annihilation effect may be reduced.

It should be noted that the present disclosure is not limited to the OLED structure described above. For example, a structure in which the blue emission layer B-EML1 is disposed in the second stack ST2 and the emission layer of a different color is disposed in the first stack ST1 is also within the scope of the present disclosure. The inventors of the present disclosure conducted various experiments (see FIGS. 4A to 10) to verify the effect of the present disclosure.

Figure 4A:
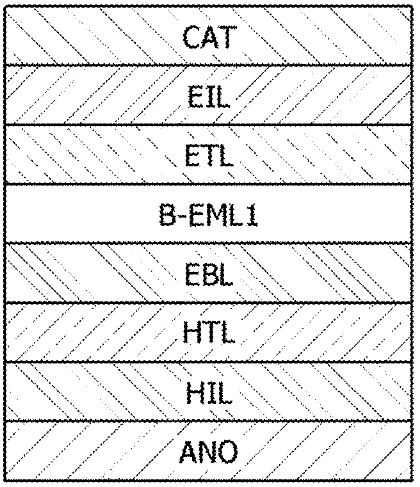
FIGS. 4A to 4C are diagrams showing OLED elements used as test target samples in a Comparative Example and Embodiments.
Figure 4B:
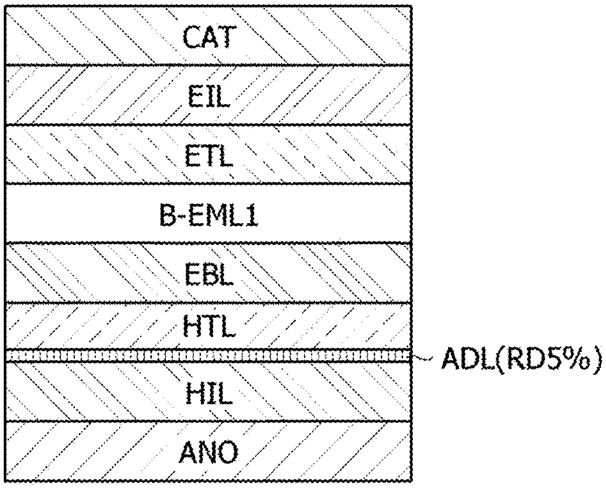
Figure 4C:
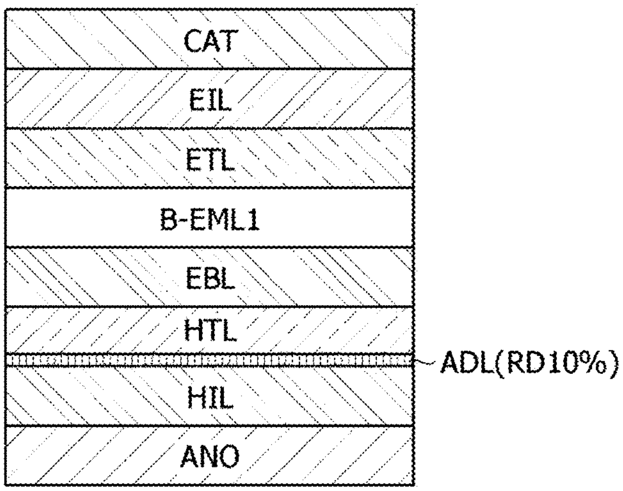
Figure 5:
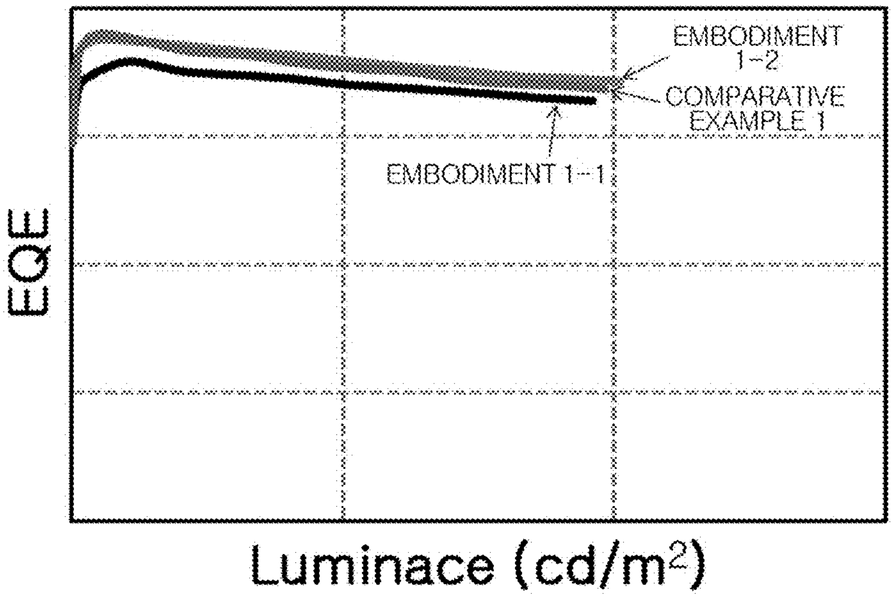
FIG. 5 is a graph showing luminance versus external quantum efficiency in Comparative Example 1 and Embodiments 1-1 and 1-2.
Figure 6:
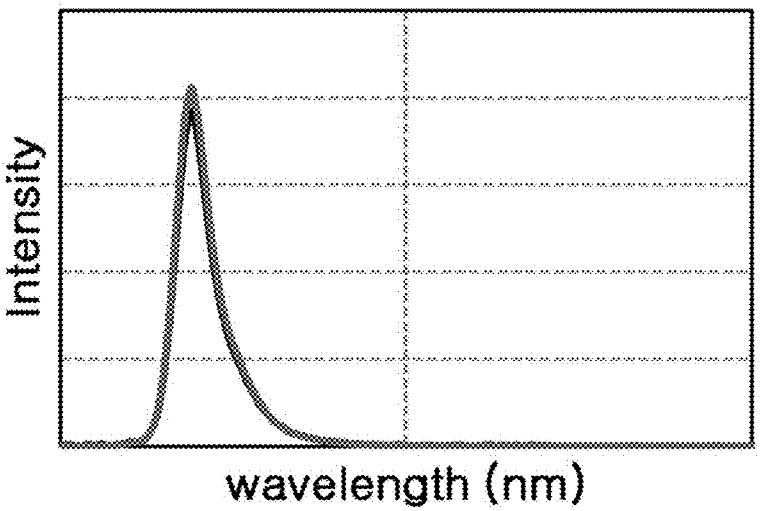
FIG. 6 is a graph showing peak wavelengths in Comparative Example 1 and Embodiments 1-1 and 1-2.
Figure 7:
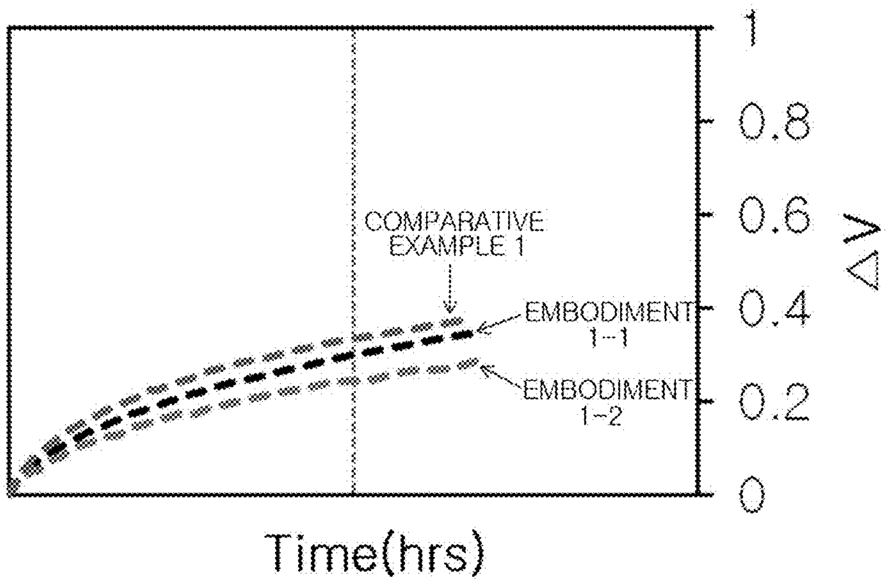
FIG. 7 is a graph showing a change in a driving voltage according to driving time in Comparative Example 1 and Embodiments 1-1 and 1-2.
Figure 8A:
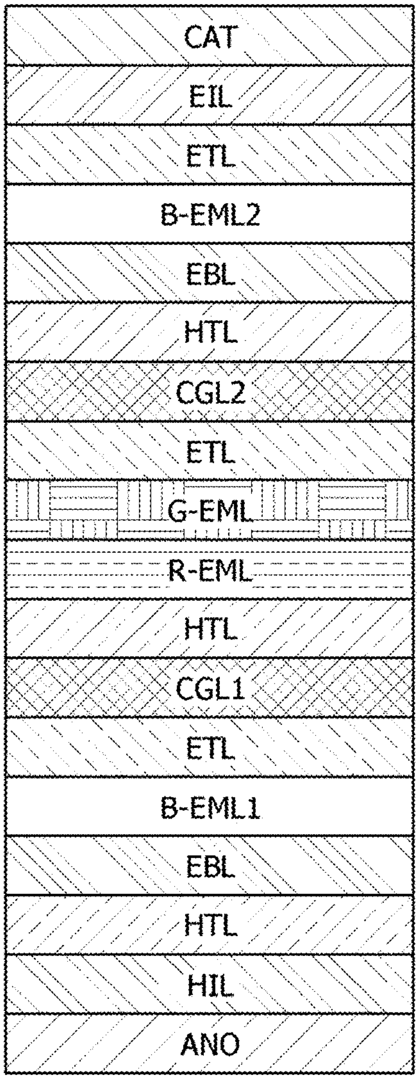
FIGS. 8A to 8C may be diagrams showing structures of OLED elements having a three-stack structure used as a test target sample.
Figure 8B:
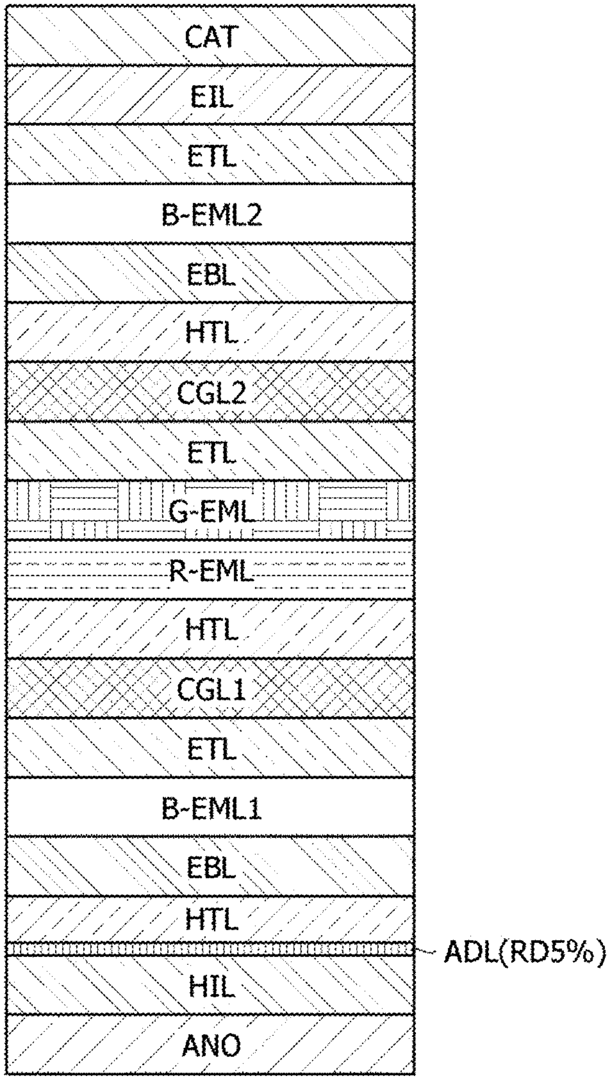
Figure 8C:
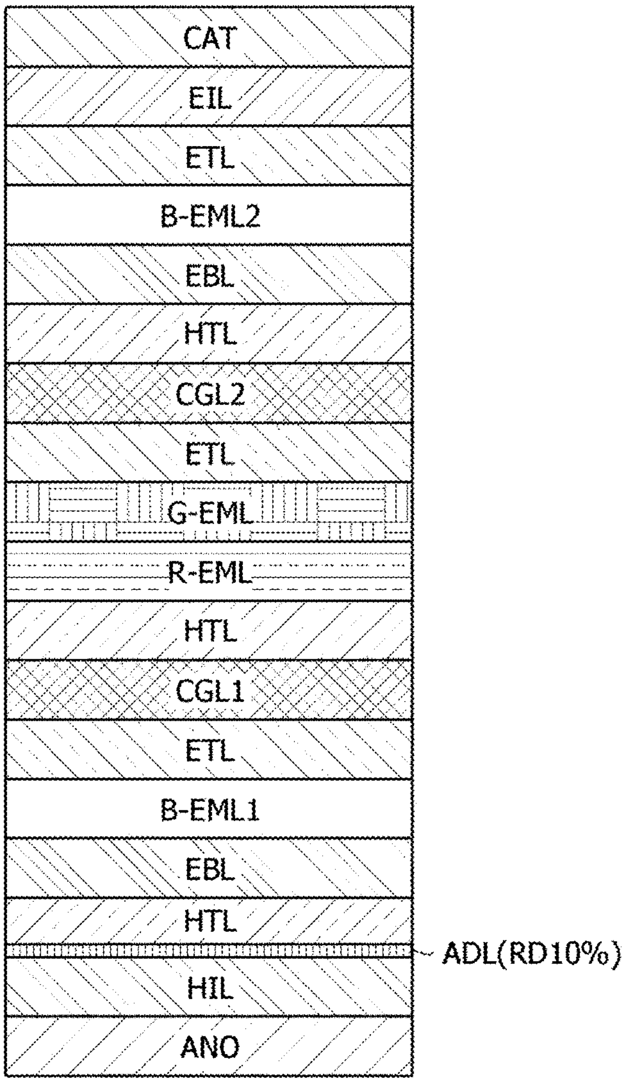
Figure 9:
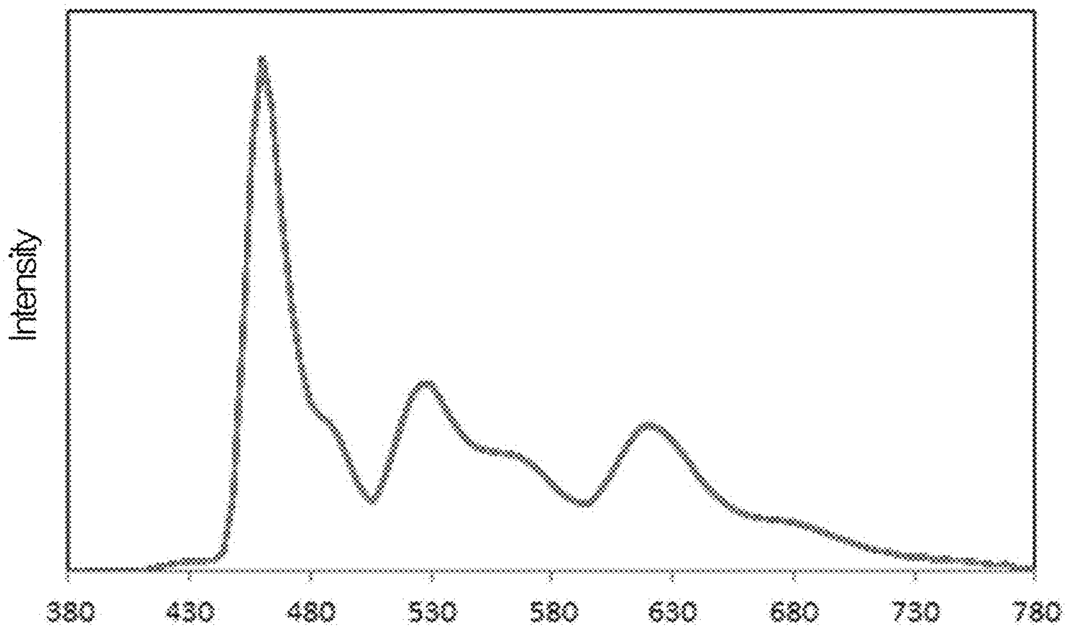
FIG. 9 is a graph showing peak wavelengths of the OLED elements shown in FIGS. 8A to 8C.
Figure 10:
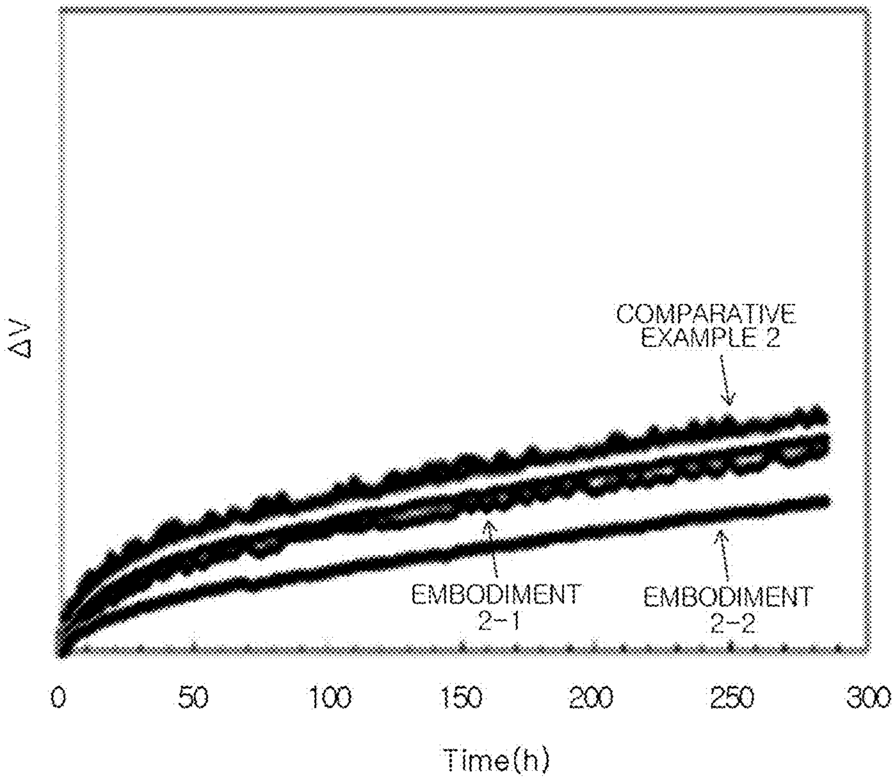
FIG. 10 is a graph showing an increase in a driving voltage as a driving time elapses, as a result of an experiment on the OLED elements shown in FIGS. 8A to 8C.

FIGS. 4A to 4C are diagrams showing OLED elements used as test target samples in a Comparative Example and Embodiments. FIG. 5 is a graph showing luminance versus external quantum efficiency in Comparative Example 1 and Embodiments 1-1 and 1-2. FIG. 6 is a graph showing peak wavelengths in Comparative Example 1 and Embodiments 1-1 and 1-2. FIG. 7 is a graph showing a change in a driving voltage according to driving time in Comparative Example 1 and Embodiments 1-1 and 1-2. FIGS. 8A to 8C may be diagrams showing structures of OLED elements having a three-stack structure used as a test target sample. FIG. 9 is a graph showing peak wavelengths of the OLED elements shown in FIGS. 8A to 8C. FIG. 10 is a graph showing an increase in a driving voltage as a driving time elapses, as a result of an experiment on the OLED elements shown in FIGS. 8A to 8C.

FIGS. 4A to 4C illustrate samples of a simple OLED element having a one-stack structure including a single emission layer. FIGS. 8A to 8C illustrate samples of an OLED element having a three-stack structure including a plurality of emission layers. In the OLED element samples used in the experiments, the anode electrode ANO, the hole injection layer HIL, the hole transport layer HTL, an electron (or exciton) blocking layer EBL, the emission layers B-EML, R-EML, and G-EML, the electron transport layer ETL, the charge generation layer CGL, the electron transport layer ETL, the electron injection layer EIL, and the cathode electrode CAT were each formed as follows.

In the OLED elements shown in the experiments of FIGS. 4A to 4C and FIGS. 8A to 8C, the anode electrode ANO was formed of ITO having a thickness of 1000 Å. The hole injection layer HIL disposed on the anode electrode ANO was a compound in which NPD and $MgF_2$ were mixed in a 1:1 composition ratio, and had a thickness of 120 Å. The hole transport layer HTL disposed on the hole injection layer HIL was formed of m-TPEE and had a thickness of 850 Å.

The electron blocking layer EBL was disposed between the hole transport layer HTL and the blue emission layer B-EML1. The electron blocking layer EBL was formed of α-NPD, and had a thickness of 150 Å. The blue emission layer B-EML1 was formed by doping MADN with 4 wt % of DABNA-1, and had a thickness of 300 Å. The electron transport layer ETL disposed on the blue emission layer B-EML1 was formed of 2-[4-(9,10-Di-naphthalen-2-yl-anthracen-2-yl)-phenyl]-1-phenyl-1H-benzoimidazole (ZADN), and had a thickness of 100 Å.

In the first charge generation layer CGL1, the nCGL was formed by doping bathophenanthroline (Bphen) with 1 wt % of Li, and had a thickness of 150 Å. The pCGL was formed by doping NPD with 10 wt % of 1,4,5,8,9,11-Hexaazatriphenylenehexacarbonitrile (HATCN), and had a thickness of 100 Å.

The hole transport layer HTL between the first charge generation layer CGL1 and the red emission layer R-EML was formed of m-TPEE, and had a thickness of 200 Å. The red emission layer R-EML was formed of a compound in which DPTPD and DCzTrz were mixed in a 1:1 composition ratio, was doped with 2 wt % of $Ir(piq)_2acac$, and had a thickness of 200 Å. The green emission layer G-EML was formed of a compound in which CBP and TPBI were mixed in a 1:1 composition ratio, was doped with 8 wt % of $Ir(ppy)_3$, and had a thickness of 200 Å.

The electron transport layer ETL between the green emission layer G-EML and the second charge generating layer CGL2 was formed of ZADN, and had a thickness of 200 Å. In the second charge generation layer CGL2, the nCGL was formed by doping bathophenanthroline (Bphen) with 1 wt % of Li, and had a thickness of 150 Å. The pCGL was formed by doping NPD with 10 wt % of 1,4,5,8,9,11-Hexaazatriphenylenehexacarbonitrile (HATCN), and had a thickness of 100 Å. The hole transport layer HTL on the pCGL was formed of m-TPEE, and had a thickness of 500 Å.

The electron blocking layer EBL was disposed between the hole transport layer HTL and the blue emission layer B-EML2. The electron blocking layer EBL was formed of α-NPD, and had a thickness of 150 Å. The blue emission layer B-EML2 was formed by doping MADN with 4 wt % of DABNA-1, and had a thickness of 300 Å.

The cathode electrode CAT was formed of aluminum (Al) having a thickness of 1000 Å. The electron transport layer ETL under the cathode electrode CAT was formed of ZADN, and had a thickness of 300 Å. The electron injection layer EIL disposed between the cathode electrode CAT and the electron transport layer ETL was formed of LiF, and had a thickness of 25 Å.

FIGS. 4A to 4C illustrate OLED elements, used as test target samples, in a Comparative Example and Embodiments. In FIGS. 4A to 4C, the OLED elements are implemented with only the first stack ST1 without the second and third stacks ST2 and ST3. FIG. 4A shows an OLED element structure having no light absorption layer ADL in Comparative Example 1. The OLED element of Embodiment 1-1 shown in FIG. 4B includes the light absorption layer ADL, in which a red phosphorescent dopant was doped by 5% into the hole transport layer HTL at the interface between the hole injection layer HIL and the hole transport layer HTL. The OLED element of Embodiment 1-2 shown in FIG. 4C includes the light absorption layer ADL, in which a red phosphorescent dopant was doped by 10% into the hole transport layer HTL at the interface between the hole injection layer HIL and the hole transport layer HTL.

In Comparative Example 1 shown in FIG. 4A, the hole transport layer HTL was an organic material having a thickness of 850 Å. In the Embodiments shown in FIGS. 4B and 4C, the hole transport layer HTL was an organic material having a thickness of 700 Å. In FIGS. 4B and 4C, the light absorption layer ADL is disposed between the hole injection layer HIL and the hole transport layer HTL. The sum of the thickness of the hole transport layer HTL and the thickness of the light absorption layer ADL was 850 Å, which is the same as the thickness of the hole transport layer HTL of Comparative Example 1.

In Embodiment 1-1 shown in FIG. 4B, the light absorption layer ADL is formed between the hole injection layer HIL and the hole transport layer HTL, and includes a red phosphorescent dopant added by 5% to the host material of the hole transport layer HTL. In Embodiment 1-2 shown in FIG. 4C, the light absorption layer ADL is formed between the hole injection layer HIL and the hole transport layer HTL, and includes a red phosphorescent dopant added by 10% to the host material of the hole transport layer HTL. In FIGS. 4B and 4C, the thickness of the light absorption layer ADL was 150 Å, e.g., 15 nm. In this experiment, the driving voltage (V), current efficiency (cd/A), and external quantum efficiency (EQE) in Comparative Example 1 and Embodiments 1-1 and 1-2 were obtained as the results shown in Table 1.

TABLE 1

| | Voltage(V) | Cd/A | EQE |
|---|---|---|---|
| Comparative Example 1 (HTL without RD) | 5.7 | 4.5 | 7.5 |
| Embodiment 1-1 (ADL = HTL + RD 5%) | 5.5 | 4.4 | 7.3 |
| Embodiment 1-2 (ADL = HTL + RD 10%) | 5.6 | 4.5 | 7.5 |

In Table 1, "RD" is a red phosphorescent dopant. The lower the driving voltage (V) of the OLED element, and the higher the current efficiency (cd/A) and external quantum efficiency (EQE), the higher the luminance may be obtained with less energy.

FIG. 5 shows an experimental result of the luminance ($Cd/m^2$) versus external quantum efficiency (EQE) in Comparative Example 1 and Embodiments 1-1 and 1-2. FIG. 6 shows an experimental result of a peak wavelength (465 nm) in Comparative Example 1 and Embodiments 1-1 and 1-2. FIG. 7 shows an experiment result of a change (ΔV) of a driving voltage over a driving time (hours "hrs") in Comparative Example 1 and Embodiments 1-1 and 1-2. As can be seen in FIGS. 6 and 7, in Comparative Example 1 and Embodiments 1-1 and 1-2, the intensity was at the same level at the peak wavelength. As also can be seen in FIGS.

6 and 7, in Embodiments 1-1 and 1-2, the problem of increasing the driving voltage was improved by reducing the rise width of the driving voltage according to the passage of the driving time, compared to Comparative Example 1.

FIGS. 8A to 8C are diagrams showing the structures of OLED elements, used as test target samples, having a three-stack structure. FIG. 8A shows an OLED element structure having no light absorption layer ADL in Comparative Example 2. The OLED element of Embodiment 2-1 shown in FIG. 8B includes the light absorption layer ADL, in which a red phosphorescent dopant was doped by 5% into the hole transport layer HTL at the interface between the hole injection layer HIL and the hole transport layer HTL. The OLED element of Embodiment 2-2 shown in FIG. 8C includes the light absorption layer ADL, in which a red phosphorescent dopant was doped by 10% into the hole transport layer HTL at the interface between the hole injection layer HIL and the hole transport layer HTL.

In FIGS. 8A to 8C, the basic structure of the OLED elements used as test target samples is substantially the same as that of FIG. 3B. In this experiment, the driving voltage (V), current efficiency (cd/A), external quantum efficiency (EQE), and color coordinate values (CIEx, CIEy) in Comparative Example 2 and Embodiments 2-1 and 2-2 were obtained as the results shown in Table 2.

TABLE 2

| | V | Cd/A | EQE | CIEx | CIEy |
|---|---|---|---|---|---|
| Comparative Example 2 (HTL without RD) | 12.4 | 67.2 | 30.2 | 0.290 | 0.294 |
| Embodiment 2-1 (ADL = HTL + RD 5%) | 12.3 | 67.5 | 30.5 | 0.291 | 0.295 |
| Embodiment 2-2 (ADL = HTL + RD 10%) | 12.4 | 66.9 | 30.3 | 0.289 | 0.295 |

The peak wavelengths and the corresponding intensities in the wavelength spectrum of the OLED elements shown in FIGS. 8A to 8C were, as shown in FIG. 9, substantially the same in Comparative Example 2 and Embodiments 2-1 and 2-2. As can be seen from the experimental results of FIG. 10, in Embodiments 2-1 and 2-2 compared to Comparative Example 2, the rise width of the driving voltage over the passage of the driving time was reduced, and as a result, the lifetime of the OLED element was improved.

The OLED elements of the present disclosure may be implemented as pixels of a display device. A pixel circuit may include an OLED element, a driving element that drives the OLED element by controlling the current flowing through the OLED element according to a gate-source voltage Vgs, one or more switch elements that switch the voltages required for driving the OLED element and the driving element, a storage capacitor that stores the gate voltage of the driving element, and the like. The driving element and the switch element may be implemented as a transistor.

Transistors of the pixel circuit may be implemented as an oxide thin-film transistor (TFT) including an oxide semiconductor, a low temperature polysilicon (LTPS) TFT including the LTPS, or the like. Further, each of the transistors may be implemented as a p-channel TFT or an n-channel TFT. In an embodiment, a description will be given focusing on an example in which the transistors of the pixel circuit are implemented as a p-channel TFT, but the present disclosure is not limited thereto.

The transistor may be a three-electrode element including a gate, a source, and a drain. The source is an electrode that supplies carriers to the transistor. In the transistor, the carriers start flowing from the source. The drain is an electrode through which the carriers exit from the transistor. In the transistor, the carriers flow from the source to the drain. In the case of an n-channel transistor, because the carriers are electrons, the source voltage is lower than the drain voltage so that electrons can flow from the source to the drain. In the n-channel transistor, a current flows from the drain to the source. In the case of a p-channel transistor (PMOS), because the carriers are holes, the source voltage is higher than the drain voltage so that holes can flow from the source to the drain. In the p-channel transistor, because holes flow from the source to the drain, a current flows from the source to the drain. It should be noted that the source and drain of the transistor may not be fixed. For example, the source and the drain may be switched according to the applied voltage. Therefore, the present disclosure is not limited due to the source and drain of the transistor. In the following description, the source and drain of the transistor will be referred to as “first” and “second” electrodes.

A gate signal swings between a gate-on voltage and a gate-off voltage. The gate-on voltage may be set higher than the threshold voltage of the transistor, and the gate-off voltage may be set lower than the threshold voltage of the transistor. The transistor may be turned on in response to the gate-on voltage, while it may be turned off in response to the gate-off voltage. In the case of the n-channel transistor, the gate-on voltage may be a gate high voltage VGH, and the gate-off voltage may be a gate low voltage VGL. In the case of the p-channel transistor, the gate-on voltage may be the gate low voltage VGL, and the gate-off voltage may be the gate high voltage VGH.

The driving elements of the pixel circuits should have uniform electrical properties in all pixels. However, due to element characteristic deviation and process deviation caused in the manufacturing process of the display panel, there may be a difference in electrical properties of the driving elements between pixels, and this difference may further increase as the driving time of the pixels elapses. To compensate for the deviation in electrical properties of the driving elements between pixels, an internal compensation technique or an external compensation technique may be applied to the display device.

The internal compensation technique may use an internal compensation circuit embedded in each pixel to sense the threshold voltage of the driving element for each sub-pixel and to compensate the gate-source voltage Vgs of the driving element by the threshold voltage. The external compensation technique may use an external compensation circuit to sense, in real time, the current or voltage of the driving element that may vary according to the electrical properties of the driving elements. In the external compensation technique, pixel data (e.g., digital data) of an input image may be modulated as much as the deviation (or change) in the electrical properties of the driving element sensed for each pixel to compensate the deviation (or change) in the electrical properties of the driving element in each pixel in real time.

Figure 11:
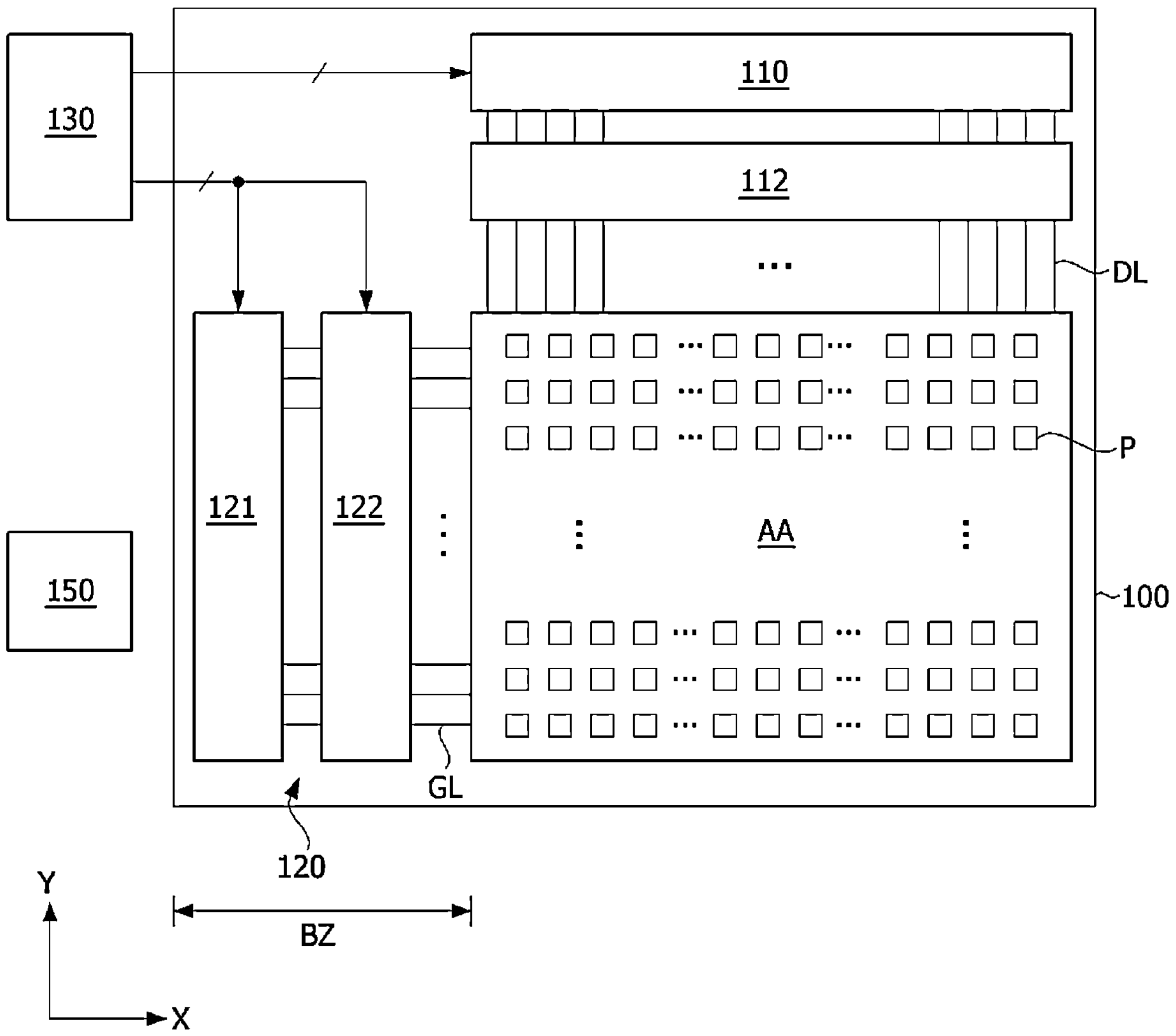
FIG. 11 is a block diagram showing a display device according to an embodiment of the present disclosure.
Figure 12:
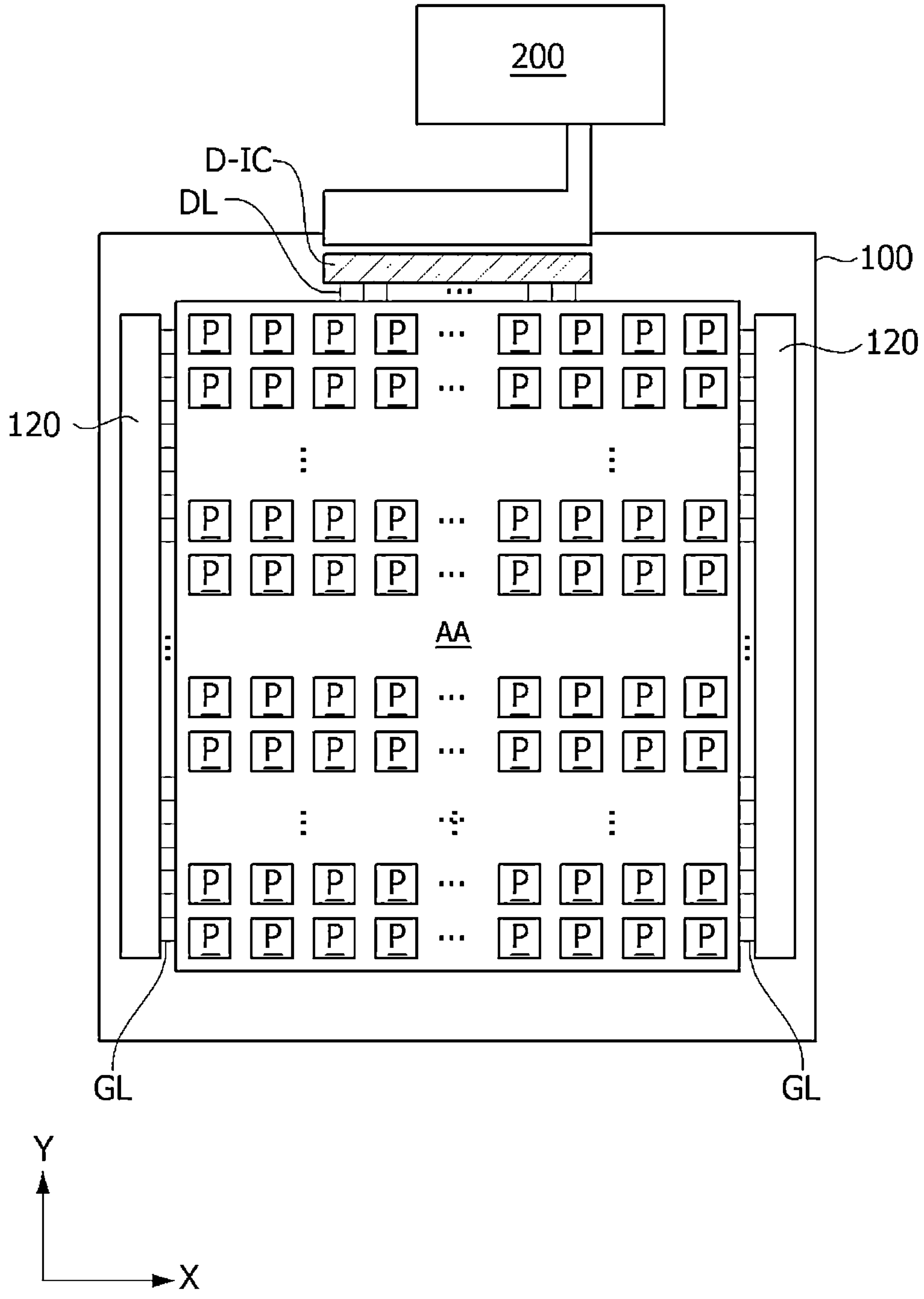
FIG. 12 is a block diagram illustrating an embodiment in which a display device according to an embodiment of the present disclosure is applied to a mobile device.

FIG. 11 is a block diagram showing a display device according to an embodiment of the present disclosure. FIG. 12 is a block diagram illustrating an embodiment in which a display device according to an embodiment of the present disclosure is applied to a mobile device.

With reference to FIGS. 11 and 12, the display device according to an embodiment of the present disclosure may include a display panel 100, a display panel driver for writing pixel data of an input image into pixels P of the display panel 100, a timing controller 130 for controlling the display panel driver, and a power supply unit 150 for generating power required for driving the display panel 100.

The display panel 100 may include a pixel array AA that displays the input image on a screen. Each of the pixels P of the pixel array AA may include sub-pixels having different colors for color reproduction. The sub-pixels may include red, green, and blue sub-pixels, hereinafter respectively referred to as "R sub-pixels," "G sub-pixels," and "B sub-pixels." Although not shown, each of the pixels P may further include a white sub-pixel, hereinafter referred to as a "W sub-pixel." Hereinafter, the term "pixel" or "dot" may be interpreted as a sub-pixel.

A sub-pixel of at least one color among the sub-pixels may include the OLED element having the above-described light absorption layer ADL. In addition, the OLED elements of the sub-pixels may be implemented in at least a two-stack structure or a tandem structure, as shown in FIGS. 3A to 3C, to generate white light. In this case, a color filter layer or a color conversion layer may be disposed in the red, green, and blue sub-pixels. The pixel circuit of the sub-pixels may be implemented as pixel circuits shown in FIGS. 13 to 15, but is not limited thereto.

Touch sensors may be disposed on the screen of the display panel 100. The touch sensors may be arranged on the screen of the display panel in an on-cell type or an add-on type, or may be implemented as in-cell type touch sensors embedded in the pixel array.

The display panel 100 may be implemented as a flexible display panel, in which the pixels P may be disposed on a flexible substrate, such as a plastic substrate or a metal substrate. In the flexible display, the size and shape of the screen may be changed, e.g., by winding, folding, or bending the flexible display panel. The flexible display may include a slidable display, a rollable display, a bendable display, a foldable display, or the like.

The display panel driver may reproduce the input image on the screen of the display panel 100 by writing the pixel data of the input image to the pixels P. The display panel driver may include a data driver 110 and a gate driver 120. The display panel driver may further include a demultiplexer 112 disposed between the data driver 110 and the data lines DL.

The data driver 110 may convert the pixel data of the input image, which may be digital data, into a gamma compensation voltage using a digital to analog converter (hereinafter referred to as "DAC") to generate a data voltage Vdata. The data driver 110 may include a voltage divider circuit that may output the gamma compensation voltage. The voltage divider circuit may divide a gamma reference voltage from the power supply unit 150 to generate the gamma compensation voltage for each gray level, and may provide it to the DAC. The DAC may convert the pixel data into the gamma compensation voltage, and may output the data voltage. The data voltage outputted from the channels of the data driver 110 may be supplied to the data lines DL of the display panel 100 through the demultiplexer 112.

The demultiplexer 112 may time-divide and distribute the data voltage Vdata outputted through the channels of the data driver 110 to the plurality of data lines DL. The number of channels of the data driver 110 may be reduced due to the demultiplexer 112. The demultiplexer 112 may be omitted. In this case, the channels of the data driver 110 may be directly connected to the data lines DL.

The gate driver 120 may be implemented as a gate-in-panel (GIP) circuit formed directly on a bezel region BZ on the display panel 100 together with a TFT array of the pixel array AA. The gate driver 120 may output a gate signal to gate lines GL under the control of the timing controller 130. The gate driver 120 may shift the gate signal using a shift register to sequentially supply the signal to the gate lines GL. The voltage of the gate signal may swing between the gate-off voltage and the gate-on voltage. The gate signal may include a scan pulse, an EM pulse, a sensing pulse, and the like shown in FIG. 16.

The gate driver 120 may be disposed on each of the left and right bezels of the display panel 100 to supply the gate signal to the gate lines GL in a double-feeding method. In the double feeding method, the gate drivers 120 on both sides may be synchronized, so that the gate signals may be simultaneously applied at both ends of one gate line. In another embodiment, the gate driver 120 may be disposed on one of the left and right bezels of the display panel 100 to supply the gate signal to the gate lines GL in a single-feeding method.

The gate driver 120 may include a first gate driver 121 and a second gate driver 122. The first gate driver 121 may output a scan pulse and a sensing pulse, and may shift the scan pulse and the sensing pulse according to a shift clock. The second gate driver 122 may output an EM pulse, and may shift the EM pulse according to a shift clock. In the case of a model having no bezel, at least some of the switch elements constituting the first and second gate drivers 121 and 122 may be distributedly disposed in the pixel array.

The timing controller 130 may receive, from a host system, the pixel data of the input image and a timing signal synchronized with the pixel data. The timing signal may include a vertical synchronization signal Vsync, a horizontal synchronization signal Hsync, a clock CLK, a data enable signal DE, and the like. One period of the vertical synchronization signal Vsync may be one frame period. One period of the horizontal synchronization signal Hsync and the data enable signal DE may be one horizontal period (1H). The pulse of the data enable signal DE may be synchronized with one line data to be written to the pixels P of one pixel line. Because the frame period and the horizontal period may be known by counting, the data enable signal DE, the vertical synchronization signal Vsync, and the horizontal synchronization signal Hsync may be omitted. The timing controller 130 may control the operation timings of the data driver 110, the demultiplexer 112, and the gate driver 120 based on the timing signals Vsync, Hsync, and DE received from the host system.

The timing controller 130 may transmit the pixel data of the input image to the data driver 110, and may synchronize the data driver 110, the demultiplexer 112, and the gate driver 120. The timing controller 130 may include a data operation unit that may modulate the pixel data by receiving sensing data obtained from the pixels P in the display panel driver to which the external compensation technique may be applied. In this case, the timing controller 130 may transmit the pixel data modulated by the data operation unit to the data driver 110.

The power supply unit 150 may include a charge pump, a regulator, a buck converter, a boost converter, a programmable gamma IC (P-GMA IC), and the like. The power supply unit 150 may generate power required for driving the display panel driver and the display panel 100 by adjusting a DC input voltage from the host system. The power supply unit 150 may output DC voltages, such as a gamma reference voltage, a gate-off voltage VGH/VEH, gate-on voltage VGL/VEL, a pixel driving voltage ELVDD, a low-potential source voltage ELVSS, an initialization voltage Vini, a reference voltage VREF, and the like. The programmable gamma IC may change a gamma reference voltage according to a register setting. The gamma reference voltage may be supplied to the data driver 110. The gate-off voltage VGH/VEH and the gate-on voltage VGL/VEL may be supplied to a level shifter and the gate driver 120. The pixel driving voltage ELVDD, the low potential source voltage ELVSS, the initialization voltage Vini, and the reference voltage VREF may be commonly supplied to the pixel circuits through power lines. The pixel driving voltage ELVDD may be set higher than the low-potential source voltage ELVSS, the initialization voltage Vini, and the reference voltage VREF.

The host system may be a television (TV) system, a set-top box, a navigation system, a personal computer (PC), a vehicle system, a home theater system, a mobile device, or a main circuit board of a wearable device. Embodiments are not limited thereto. In a mobile device or a wearable device, the timing controller 130, the data driver 110, and the power supply unit 150 may be integrated into one drive integrated circuit (D-IC), as shown in the example of FIG. 12. In FIG. 12, reference numeral "200" denotes the host system.

Figure 13:
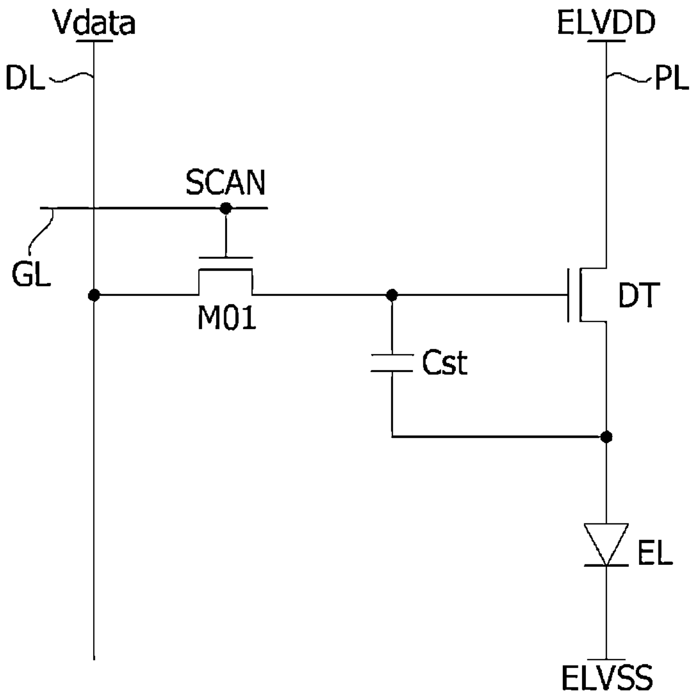
FIGS. 13 to 15 are circuit diagrams showing various pixel circuits applicable to a pixel circuit of the present disclosure.
Figure 14:
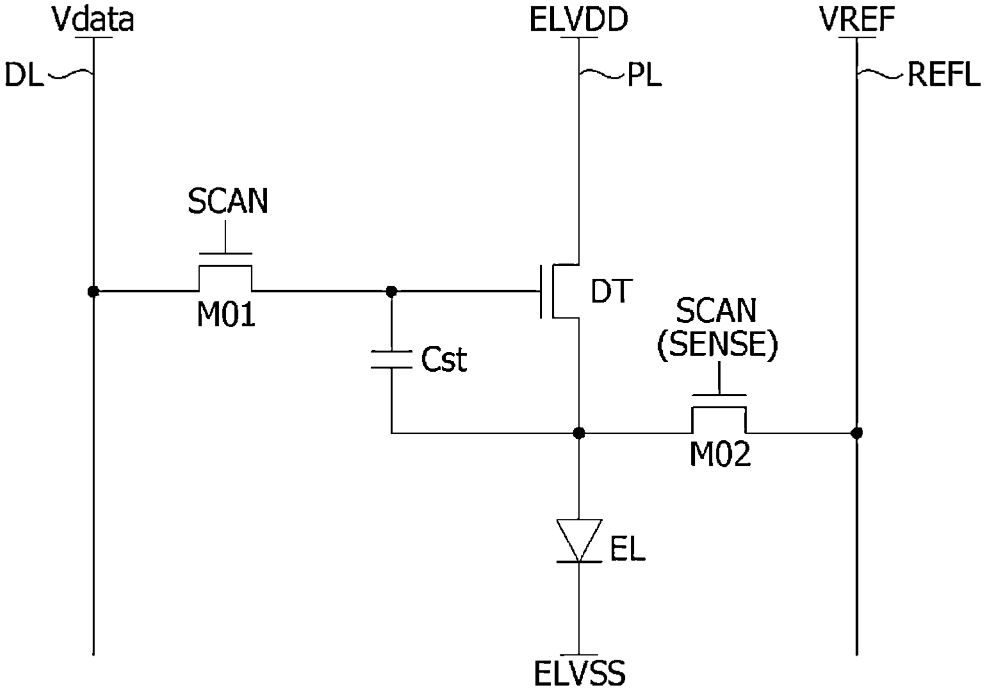
Figure 15:
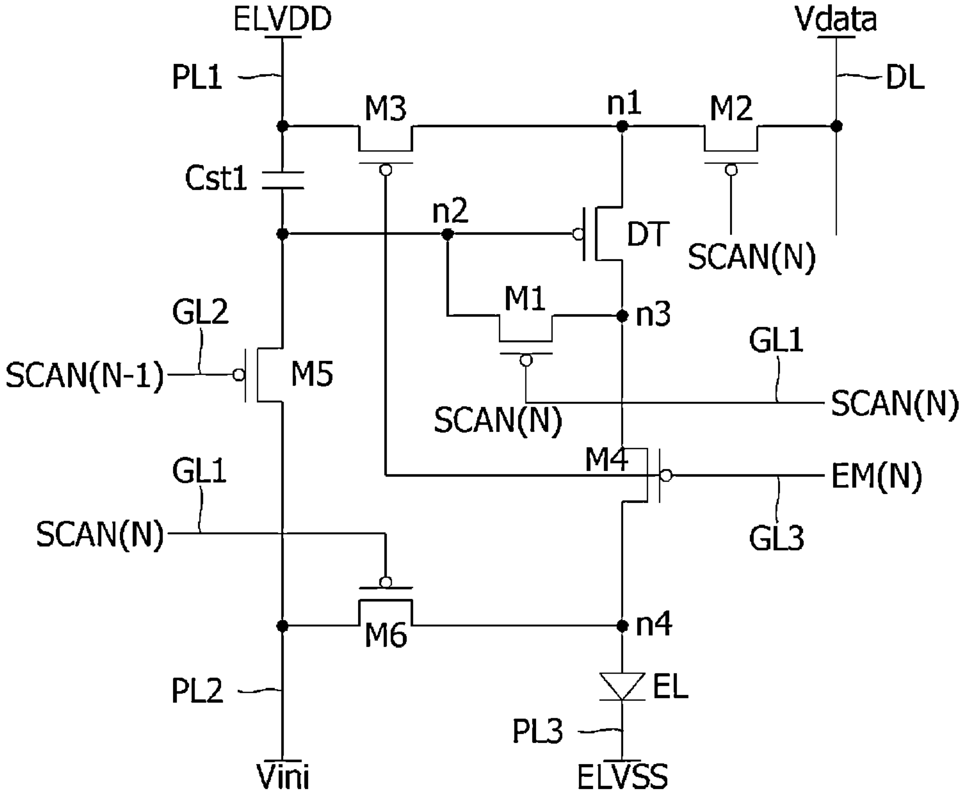
Figure 16:
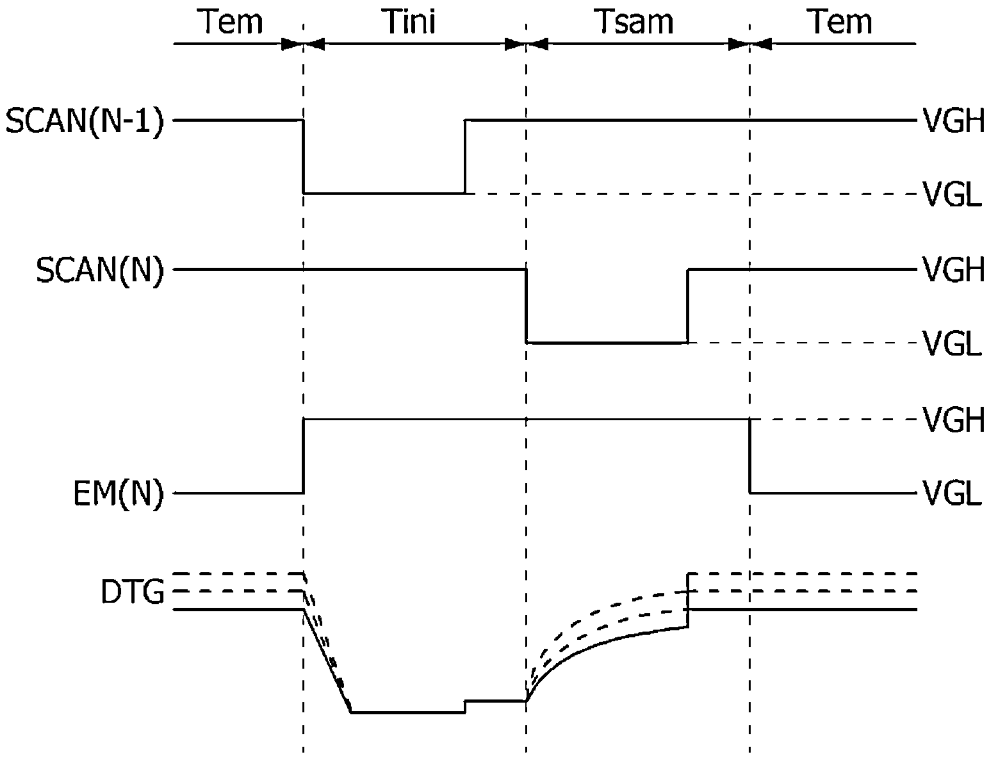
FIG. 16 is a waveform diagram showing a method of driving the pixel circuit shown in FIG. 15.

FIGS. 13 to 15 are circuit diagrams showing various pixel circuits applicable to the pixel circuit of the present disclosure. FIG. 16 is a waveform diagram showing a method of driving the pixel circuit shown in FIG. 15.

With reference to FIG. 13, the pixel circuit may include an OLED element EL, a driving element DT that supplies current to the OLED element EL, a switch element M01 that connects a data line DL in response to a scan pulse SCAN, and a capacitor Cst connected to the gate of the driving element DT. The driving element DT and the switch element M01 may be implemented with n-channel transistors.

The pixel driving voltage ELVDD may be applied to a first electrode of the driving element DT through a power line PL. The driving element DT may drive the OLED element EL by supplying a current to the OLED element EL according to the gate-source voltage Vgs. The OLED element EL may be turned on and emits light when a forward voltage between the anode electrode and the cathode electrode may be greater than or equal to the threshold voltage. The capacitor Cst may be connected between the gate electrode and the source electrode of the driving element DT to maintain the gate-source voltage Vgs of the driving element DT.

FIG. 14 is an example of a pixel circuit connected to an external compensation circuit. With reference to FIG. 14, the pixel circuit further may include a second switch element M02 connected between a reference voltage line REFL and a second electrode (or source) of the driving element DT. In this pixel circuit, the driving element DT and the switch elements M01 and M02 may be implemented with n-channel transistors.

The second switch element M02 applies the reference voltage VREF in response to the scan pulse SCAN or a separate sensing pulse SENSE. The reference voltage VREF may be applied to the pixel circuit through the reference voltage line REFL.

In a sensing mode, a current flowing through a channel of the driving element DT or a voltage between the driving element DT and the OLED element EL may be sensed through the reference voltage line REFL. A current flowing through the reference voltage line REFL may be converted into a voltage through an integrator and converted into digital data through an analog-to-digital converter (ADC). The digital data may be sensing data including information on mobility or the threshold voltage of the driving element DT. The sensing data may be transmitted to the data operation unit of the timing controller 130. The data operation unit may receive the sensing data from the ADC and add or multiply a compensation value selected based on the sensing data to or by the pixel data to compensate for driving deviation and deterioration of the pixels.

FIG. 15 is a circuit diagram showing one example of a pixel circuit to which an internal compensation circuit may be applied. FIG. 16 shows a method of driving the pixel circuit shown in FIG. 15. In FIG. 16, "DTG" is the gate voltage of the driving element DT, that is, the voltage of the second node n2 illustrated in FIG. 15.

With reference to FIGS. 15 and 16, the pixel circuit may include the OLED element EL, the driving element DT that supplies a current to the OLED element EL, and a switch circuit that switches voltages applied to the OLED element EL and the driving element DT.

The switch circuit may be connected to power lines PL1, PL2, and PL3 to which the pixel driving voltage ELVDD, the initialization voltage Vini, and the low-potential source voltage ELVSS may be applied, the data line DL, and gate lines GL1, GL2, and GL3, and switches the voltages applied to the OLED element EL and the driving element DT in response to scan pulses SCAN(N−1), SCAN(N) and an EM pulse EM(N).

The switch circuit samples a threshold voltage Vth of the driving element DT using a plurality of switch elements M1 to M6 and stores it in a capacitor Cst1. The switch circuit may include an internal compensation circuit that compensates the gate voltage of the driving element DT by the threshold voltage Vth of the driving element DT. Each of the driving element DT and the switch elements M1 to M6 may be implemented with a p-channel TFT.

The driving period of the pixel circuit shown in FIG. 15 may, as shown in the example of FIG. 16, be divided into an initialization period Tini, a sampling period Tsam, and a light emission period Tem.

An $N^{th}$ scan pulse SCAN(N) may be generated as the gate-on voltage VGL in the sampling period Tsam and may be applied to a first gate line GL1. An $(N-1)^{th}$ scan pulse SCAN(N−1) may be generated as the gate-on voltage VGL in the initialization period Tini prior to the sampling period and may be applied to a second gate line GL2. The EM pulse EM(N) may be generated as the gate-off voltage VGH during the initialization period Tini and the sampling period Tsam, and may be applied to a third gate line GL3.

During the initialization period Tini, the $(N-1)^{th}$ scan pulse SCAN(N−1) may be generated as the gate-on voltage VGL, and the voltage of each of the $N^{th}$ scan pulse SCAN (N) and the EM pulse EM(N) may be the gate-off voltage VGH. During the sampling period Tsam, the $N^{th}$ scan pulse SCAN(N) may be generated as the pulse of the gate-on voltage VGL, and the voltage of each of the $(N-1)^{th}$ scan pulse SCAN(N−1) and the EM pulse EM(N) may be the gate-off voltage VGH. During at least a part of the light emission period Tem, the EM pulse EM(N) may be generated as the gate-on voltage VGL, and the voltage of each of the $(N-1)^{th}$ scan pulse SCAN(N−1) and the $N^{th}$ scan pulse SCAN(N) may be generated as the gate-off voltage VGH.

During the initialization period Tini, a fifth switch element M5 may be turned on according to the gate-on voltage VGL of the $(N-1)^{th}$ scan pulse SCAN(N−1) to initialize the pixel circuit. During the sampling period Tsam, first and second switch elements M1 and M2 may be turned on according to the gate-on voltage VGL of the $N^{th}$ scan pulse SCAN(N), and the data voltage Vdata compensated by the threshold voltage of the driving element DT may be stored in the capacitor Cst1. At the same time, a sixth switch element M6 may be turned on during the sampling period Tsam to lower the voltage of a fourth node n4 to the reference voltage VREF, thereby suppressing the light emission of the OLED element EL.

During the light emission period Tem, third and fourth switch elements M3 and M4 may be turned on, so that the OLED element EL emits light. During the light emission period Tem, to accurately express the luminance of the low gradation, the voltage level of the EM pulse EM(N) may be inverted at a predetermined duty ratio between the gate-on voltage VGL and the gate-off voltage VGH. In this case, the third and fourth switch elements M3 and M4 may repeatedly turn on and off according to the duty ratio of the EM pulse EM(N) during the light emission period Tem.

The anode electrode of the OLED element EL may be connected to the fourth node n4 between the fourth and sixth switch elements M4 and M6. The fourth node n4 may be connected to the anode electrode of the OLED element EL, the second electrode of the fourth switch element M4, and the second electrode of the sixth switch element M6. The cathode electrode of the OLED element EL may be connected to a VSS line PL3 to which the low-potential source voltage ELVSS may be applied. The OLED element EL emits light by a current Ids flowing according to the gate-source voltage Vgs of the driving element DT. The current path of the OLED element EL may be switched by the third and fourth switch elements M3 and M4.

The capacitor Cst1 may be connected between a VDD line PL1 and a second node n2. The first switch element M1 may be turned on in response to the gate-on voltage VGL of the $N^{th}$ scan pulse SCAN(N) to connect the second node n2 to a third node n3. Because the first switch element M1 may be turned on for one horizontal period 1H, which may be very short, in which the $N^{th}$ scan pulse SCAN(N) may be generated as the gate-on voltage VGL in one frame period, a leakage current may occur in the off state. To suppress the leakage current of the first switch element M1, the first switch element M1 may be implemented with a transistor having a dual gate structure in which two transistors may be connected in series.

The second switch element M2 may be turned on in response to the gate-on voltage VGL of the $N^{th}$ scan pulse SCAN(N) to supply the data voltage Vdata to a first node n1. The gate electrode of the second switch element M2 may be connected to the first gate line GL1 to receive the $N^{th}$ scan pulse SCAN(N). The third switch element M3 may be turned on in response to the gate-on voltage VGL of the EM pulse EM(N) to connect the VDD line PL1 to the first node n1. The gate electrode of the third switch element M3 may be connected to the third gate line GL3 to receive the EM pulse EM(N).

The fourth switch element M4 may be turned on in response to the gate-on voltage VGL of the EM pulse EM(N) to connect the third node n3 to the anode electrode of the OLED element EL. The gate electrode of the fourth switch element M4 may be connected to the third gate line GL3 to receive the EM pulse EM(N). The fifth switch element M5 may be turned on in response to the gate-on voltage VGL of the $(N-1)^{th}$ scan pulse SCAN(N−1) to connect the second node n2 to a Vini line PL2. The gate electrode of the fifth switch element M5 may be connected to the second gate line GL2 to receive the $(N-1)^{th}$ scan pulse SCAN(N−1).

The sixth switch element M6 may be turned on in response to the gate-on voltage VGL of the $N^{th}$ scan pulse SCAN(N) to connect the Vini line PL2 to the fourth node n4. The gate electrode of the sixth switch element M6 may be connected to the first gate line GL1 to receive the $N^{th}$ scan pulse SCAN(N).

In another embodiment, the gate electrodes of the fifth and sixth switch elements M5 and M6 may be commonly connected to the second gate line GL2 to which the $(N-1)^{th}$ scan pulse SCAN(N−1) may be applied. In this case, the fifth and sixth switch elements M5 and M6 may be simultaneously turned on in response to the $(N-1)^{th}$ scan pulse SCAN(N−1).

The driving element DT may drive the OLED element EL by controlling the current flowing through the OLED element EL according to the gate-source voltage Vgs. The driving element DT may include a gate connected to the second node n2, a first electrode connected to the first node n1, and a second electrode connected to the third node n3.

The present disclosure may generate a triplet exciton at the interface between the hole injection layer and the hole transport layer by adding a material that absorbs short wavelength light in the visible band to at least one of the hole injection layer and the hole transport layer, and may use the material to induce the combination of a hole and the triplet exciton.

The present disclosure may reduce or prevent deterioration of the interface between the hole injection layer and the hole transport layer when driving the organic light emitting diode, thereby reducing or minimizing an increase in the driving voltage and improving the lifetime and stability of the element when driving the organic light emitting diode for a long time.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. An organic light-emitting diode, comprising:
a hole injection layer;
a hole transport layer on the hole injection layer; and
a first emission layer configured to generate light of a short wavelength in a visible band, the first emission layer being on the hole transport layer,
wherein one or more of the hole injection layer and the hole transport layer comprises a phosphorescent dopant material at an interface between the hole injection layer and the hole transport layer,
wherein the first emission layer is configured to emit blue light, and
wherein the phosphorescent dopant material is configured to absorb the blue light to generate triplet excitons that are combined with holes at the interface between the hole injection layer and the hole transport layer.

2. The organic light-emitting diode of claim 1, wherein the phosphorescent dopant material comprises a red phosphorescent dopant material configured to generate red light.

3. The organic light-emitting diode of claim 1, wherein a triplet energy level of the interface between the hole injection layer and the hole transport layer ranges from 2.0 eV to 2.5 eV.

4. The organic light-emitting diode of claim 3, wherein a highest occupied molecular orbital (HOMO) level of the interface between the hole injection layer and the hole transport layer is equal to or smaller than the HOMO level of the hole transport layer.

5. The organic light-emitting diode of claim 4, wherein:

light absorbed by the interface between the hole injection layer and the hole transport layer has a wavelength of 530 nm or less in the visible band; and a peak wavelength of light emitted from the interface between the hole injection layer and the hole transport layer is 550 nm or more in the visible band.

6. The organic light-emitting diode of claim 3, wherein a thickness of the interface between the hole injection layer and the hole transport layer ranges from 5 nm to 30 nm.

7. The organic light-emitting diode of claim 6, wherein a concentration of the phosphorescent dopant material in the interface between the hole injection layer and the hole transport layer ranges from 0.1 wt % to 15 wt %.

8. The organic light-emitting diode of claim 7, wherein, when the hole injection layer contains an inorganic material, the phosphorescent dopant material is added to the hole transport layer.

9. The organic light-emitting diode of claim 1, further comprising:

a second stack on the first emission layer, the second stack comprising at least one second emission layer configured to emit light having a wavelength different from that of light emitted from the first emission layer;

a third stack on the second stack, the third stack comprising a third emission layer configured to emit light having a same wavelength as that of the light emitted from the first emission layer;

an electron injection layer between the third emission layer and a cathode electrode; and an electron transport layer between the electron injection layer and the third emission layer.

10. The organic light-emitting diode of claim 9, wherein the second emission layer comprises:

a first red emission layer configured to emit red light; and a second yellow-green emission layer configured to emit yellow-green light.

11. The organic light-emitting diode of claim 9, wherein the second emission layer comprises:

a first red emission layer configured to emit red light; and a second green emission layer configured to emit green light.

12. The organic light-emitting diode of claim 9, wherein the second emission layer comprises:

a first red emission layer configured to emit red light;

a second yellow-green emission layer configured to emit yellow-green light; and a third green emission layer configured to emit green light.

13. An organic light-emitting diode, comprising:

an anode electrode;

a cathode electrode;

a first stack comprising:

a hole injection layer on the anode electrode, a hole transport layer on the hole injection layer, a first emission layer on the hole transport layer, the first emission layer being configured to emit light having a peak wavelength within a range of 430 nm to 480 nm, and wherein one or more of the hole injection layer and the hole transport layer comprises a phosphorescent dopant material at an interface between the hole injection layer and the hole transport layer; and a second stack between the cathode electrode and the first stack, the second stack comprising at least one second emission layer configured to emit light having a wavelength longer than a wavelength of light emitted from the first emission layer, wherein the interface between the hole injection layer and the hole transport layer is configured to:

absorb light from the first emission layer using the phosphorescent dopant material, and emit light having a wavelength of 550 nm or more in a visible band.

14. The organic light-emitting diode of claim 13, further comprising a third stack between the cathode electrode and the second stack, the third stack comprising a third emission layer configured to emit light having a wavelength the same as the wavelength of the light emitted from the first emission layer.

15. The organic light-emitting diode of claim 13, wherein:

a thickness of the interface between the hole injection layer and the hole transport layer ranges from 5 nm to 30 nm; and a concentration of the phosphorescent dopant material in the interface between the hole injection layer and the hole transport layer ranges from 0.1 wt % to 15 wt %.

16. A display device, comprising:

a display panel in which pixels displaying an input image are arranged; and a display panel driver configured to write pixel data of the input image to the pixels of the display panel, wherein each of the pixels comprises:

an organic light-emitting diode, comprising:

a hole injection layer, a hole transport layer on the hole injection layer, and a first emission layer configured to generate light of a short wavelength in a visible band, the first emission layer being on the hole transport layer, and a phosphorescent dopant material added to at least one of: the hole injection layer and the hole transport layer at an interface between the hole injection layer and the hole transport layer, wherein the first emission layer is configured to emit blue light, and wherein the interface between the hole injection layer and the hole transport layer is configured to absorb the blue light to generate triplet excitons that are combined with holes.

17. The display device of claim 16, further comprising:

a second stack on the first emission layer, the second stack comprising at least one second emission layer configured to emit light having a wavelength different from that of light emitted from the first emission layer;

a third stack on the second stack, the third stack comprising a third emission layer configured to emit light having a same wavelength as that of the light emitted from the first emission layer;

an electron injection layer between the third emission layer and a cathode electrode; and an electron transport layer between the electron injection layer and the third emission layer.

* * * * *